(12) United States Patent
Sio et al.

(10) Patent No.: US 10,516,047 B2
(45) Date of Patent: Dec. 24, 2019

(54) STRUCTURE AND FORMATION METHOD OF SEMICONDUCTOR DEVICE STRUCTURE

(71) Applicant: Taiwan Semiconductor Manufacturing Co., Ltd., Hsinchu (TW)

(72) Inventors: Kam-Tou Sio, Zhubei (TW); Jiann-Tyng Tzeng, Hsinchu (TW); Charles Chew-Yuen Young, Cupertino, CA (US); Yi-Ming Sheu, Hsinchu (TW); Chun-Fu Cheng, Zhubei (TW); Yi-Han Wang, Beigang Township, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1 day.

(21) Appl. No.: 15/471,318

(22) Filed: Mar. 28, 2017

(65) Prior Publication Data
US 2018/0151729 A1    May 31, 2018

Related U.S. Application Data

(60) Provisional application No. 62/426,964, filed on Nov. 28, 2016.

(51) Int. Cl.
| | | |
|---|---|---|
| H01L 29/775 | (2006.01) | |
| H01L 29/78 | (2006.01) | |
| H01L 21/02 | (2006.01) | |
| H01L 21/306 | (2006.01) | |
| H01L 21/762 | (2006.01) | |
| H01L 29/417 | (2006.01) | |
| H01L 29/423 | (2006.01) | |

(52) U.S. Cl.
CPC .... *H01L 29/7845* (2013.01); *H01L 21/02636* (2013.01); *H01L 21/30604* (2013.01); *H01L 21/76224* (2013.01); *H01L 29/41775* (2013.01); *H01L 29/42316* (2013.01)

(58) Field of Classification Search
None
See application file for complete search history.

(56) References Cited

U.S. PATENT DOCUMENTS

| | | | | |
|---|---|---|---|---|
| 2007/0001219 A1* | 1/2007 | Radosavljevic | .. | H01L 29/41791 257/327 |
| 2011/0049629 A1* | 3/2011 | Ishikawa | ........... | H01L 21/76243 257/350 |

(Continued)

*Primary Examiner* — Joseph C. Nicely
*Assistant Examiner* — Lamont B Koo
(74) *Attorney, Agent, or Firm* — McClure, Qualey & Rodack, LLP

(57) ABSTRACT

Structures and formation methods of a semiconductor device structure are provided. The semiconductor device structure includes a dielectric layer. The semiconductor device structure also includes a gate stack structure in the dielectric layer. The semiconductor device structure further includes a semiconductor wire partially surrounded by the gate stack structure. In addition, the semiconductor device structure includes a contact electrode in the dielectric layer and electrically connected to the semiconductor wire. The contact electrode and the gate stack structure extend from the semiconductor wire in opposite directions.

20 Claims, 26 Drawing Sheets

(56) References Cited

U.S. PATENT DOCUMENTS

| | | | | |
|---|---|---|---|---|
| 2014/0027855 A1* | 1/2014 | Bangsaruntip | ......... | B82Y 10/00 |
| | | | | 257/351 |
| 2014/0252496 A1* | 9/2014 | Liu | ............ | H01L 29/40 |
| | | | | 257/401 |
| 2015/0262876 A1* | 9/2015 | Yang | ............ | H01L 21/76897 |
| | | | | 257/401 |
| 2015/0295089 A1* | 10/2015 | Huang | ............ | H01L 29/7853 |
| | | | | 257/401 |
| 2016/0163706 A1* | 6/2016 | Kim | ............ | H01L 27/0924 |
| | | | | 257/369 |
| 2017/0084721 A1* | 3/2017 | Hung | ............ | H01L 29/66795 |

* cited by examiner

STRUCTURE AND FORMATION METHOD OF SEMICONDUCTOR DEVICE STRUCTURE

CROSS REFERENCE TO RELATED APPLICATIONS

This Application claims the benefit of U.S. Provisional Application No. 62/426,964, filed on Nov. 28, 2016, and entitled "Structure and formation method of semiconductor device structure", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a semiconductor device with nanowires, has been introduced to replace planar transistors. These relatively new types of semiconductor IC devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
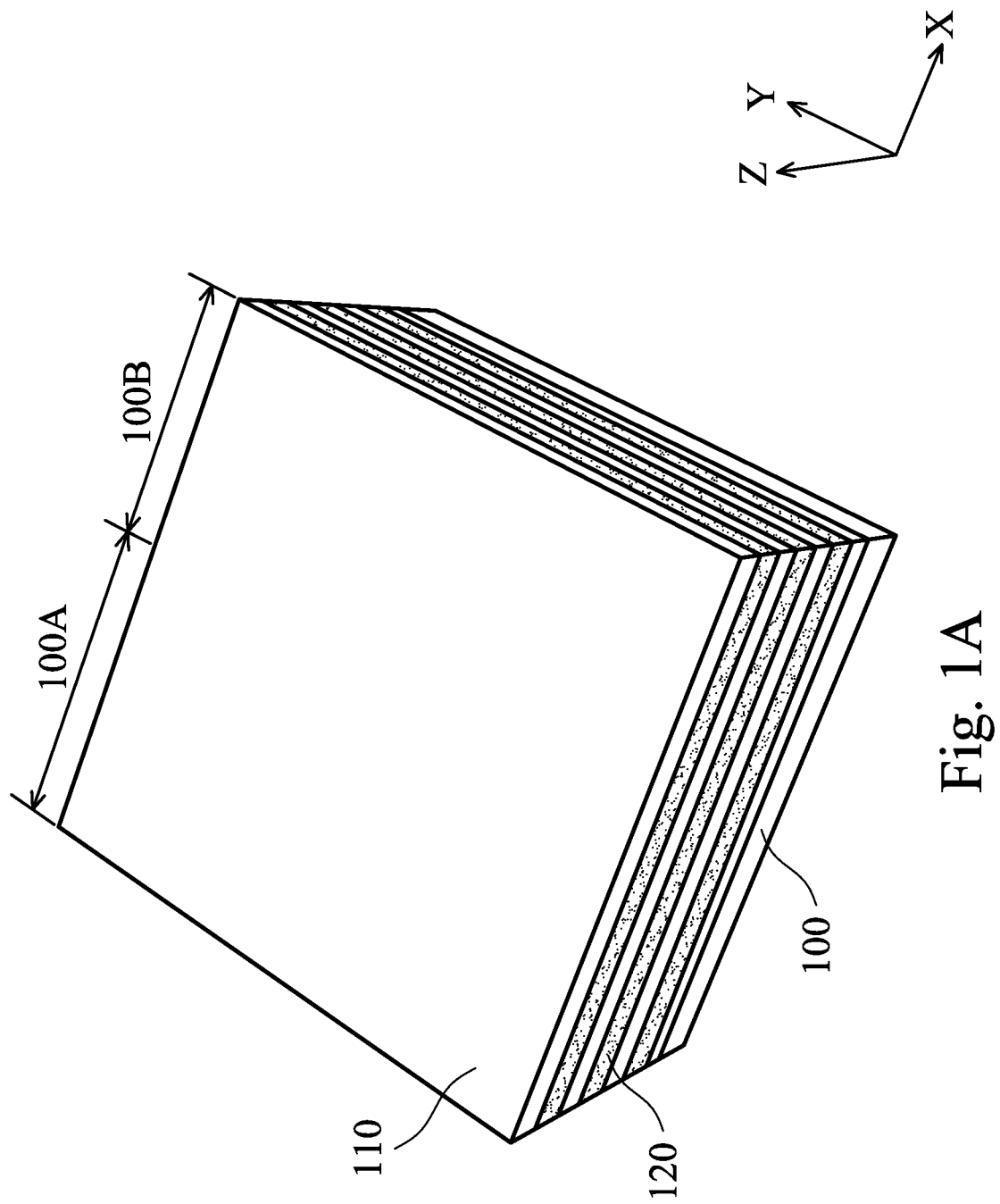
FIGS. 1A-1Q are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and they are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For a better understanding of a semiconductor device structure, an X-Y-Z coordinate reference is provided in figures. The X-axis is generally orientated along a substrate surface of a semiconductor device structure in the lateral direction. The Y-axis is generally oriented along the substrate surface perpendicular to the X-axis. The Z-axis is oriented generally along the substrate surface in the vertical direction perpendicular to the X-Y plane.

Some embodiments of the disclosure are described. FIGS. 1A-1N are perspective views of various stages of a process for forming a semiconductor device structure, in accordance with some embodiments. Additional operations can be provided before, during, and/or after the stages described in FIGS. 1A-1N. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include germanium tin, silicon germanium tin, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In accordance with some embodiments, multiple regions 100A and 100B are defined over the semiconductor substrate 100. One of the regions 100A and one of the regions 100B are shown in FIG. 1A. In some embodiments, gate stacks and contact features are configured to be formed in the regions 100A and the regions 100B, respectively. The gate stacks and the contact features will be described in more detail later. The regions 100A may be referred to as gate regions. The regions 100B may be referred to as contact regions.

As shown in FIG. 1A, a stacked layer is deposited over the semiconductor substrate 100 in the regions 100A and the regions 100B, in accordance with some embodiments. The stacked layer includes multiple alternately deposited dielectric layers 110 and semiconductor layers 120. The dielectric layers 110 and the semiconductor layers 120 are stacked vertically and positioned at different levels. In some embodiments, the bottommost of the dielectric layers 110 is covered by the bottommost of the semiconductor layers 120. In some embodiments, the topmost of the semiconductor layers 120 is covered by the topmost of the dielectric layers 110.

Although FIG. 1A shows that the dielectric layers 110 and the semiconductor layers 120 have substantially the same thickness along the Z-axis, embodiments of the disclosure are not limited thereto. In some other embodiments, the dielectric layers 110 and the semiconductor layers 120 have different thicknesses along the Z-axis. The dielectric layers 110 may be thicker or thinner than the semiconductor layers 120.

Many variations and/or modifications can be made to embodiments of the disclosure. In some other embodiments, multiple dielectric layers 110 and one semiconductor layer 120 are stacked vertically over the semiconductor substrate 100. The semiconductor layer 120 is sandwiched between the dielectric layers 110.

In some embodiments, the dielectric layers 110 include oxide, nitride, another suitable material, or a combination thereof. For example, the dielectric layers 110 may include aluminum oxide, silicon oxide, silicon nitride, silicon carbonitride (SiCN), silicon oxycarbide (SiOC), or another suitable dielectric material. In some embodiments, the dielectric layers 110 are deposited using a chemical vapor deposition (CVD) process, a spray coating process, a spin-on process, an atomic layer deposition (ALD) process, a physical vapor deposition (PVD) process, another applicable process, or a combination thereof.

In some embodiments, the semiconductor layers 120 include silicon, germanium, silicon germanium, germanium tin, silicon germanium tin, or another suitable semiconductor material. In some embodiments, the semiconductor layers 120 are deposited using an epitaxial growth process. Each of the semiconductor layers 120 may be deposited using a selective epitaxial growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy (MBE) process, another applicable process, or a combination thereof.

Figure 1B:
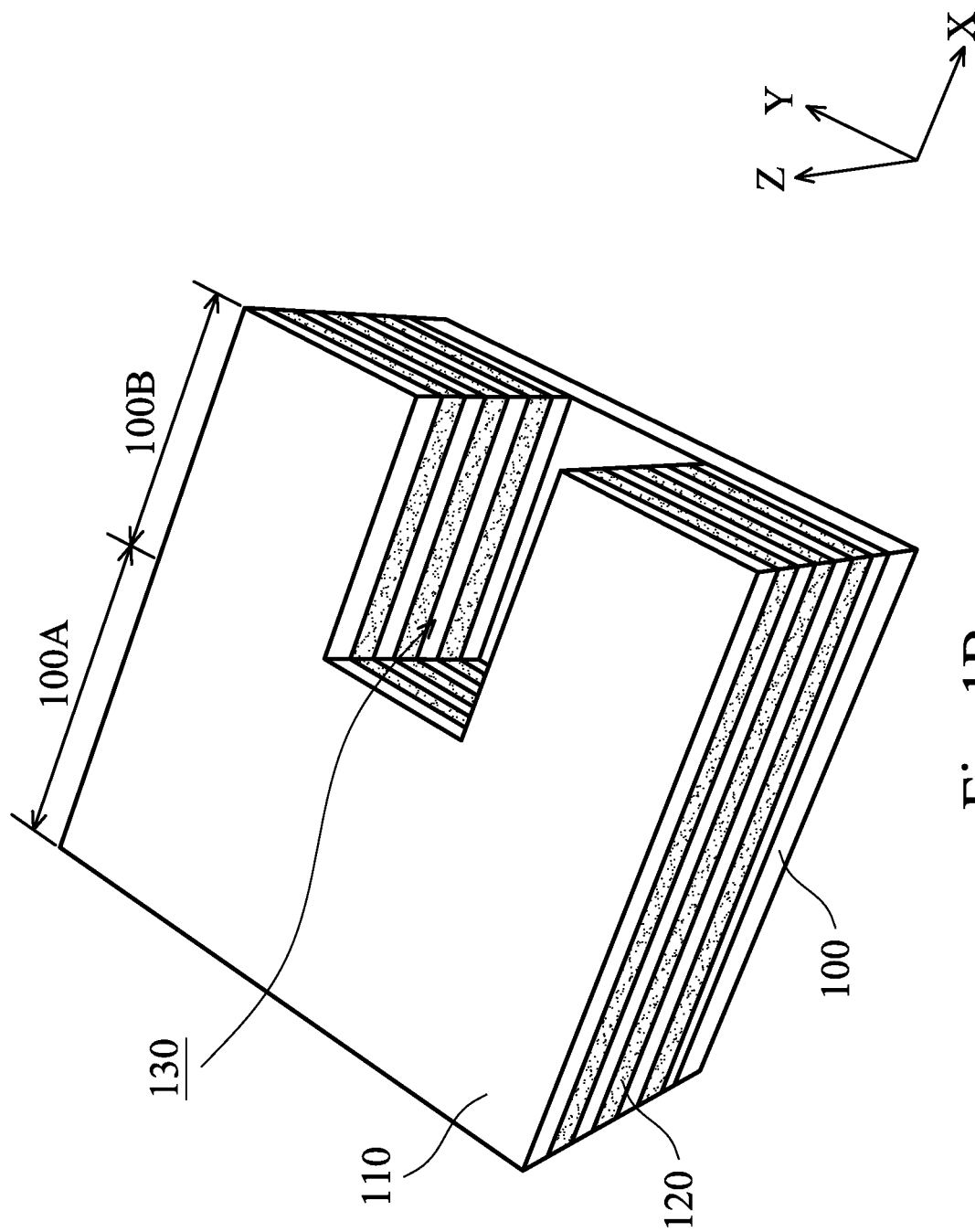

As shown in FIG. 1B, the dielectric layers 110 and the semiconductor layers 120 in the regions 100B are partially removed, in accordance with some embodiments. As a result, multiple trenches (or recesses) 130 are formed in the dielectric layers 110 and the semiconductor layers 120 in the regions 100B. One of the trenches 130 is shown in FIG. 1B.

In some embodiments, the trenches 130 penetrate through the dielectric layers 110 and the semiconductor layers 120 and expose the semiconductor substrate 100 in the regions 100B.

In some embodiments, multiple photolithography processes and etching processes are performed to form the trenches 130. In some embodiments, the etching process includes a wet etching process, a dry etching process, or another suitable etching process. In some embodiments, a patterned mask layer (not shown) is formed over the topmost of the dielectric layers 110 to assist in the formation of the trenches 130. For example, the patterned mask layer covers the regions 100A and partially exposes the regions 100B to define the positions of the trenches 130.

Figure 1C:
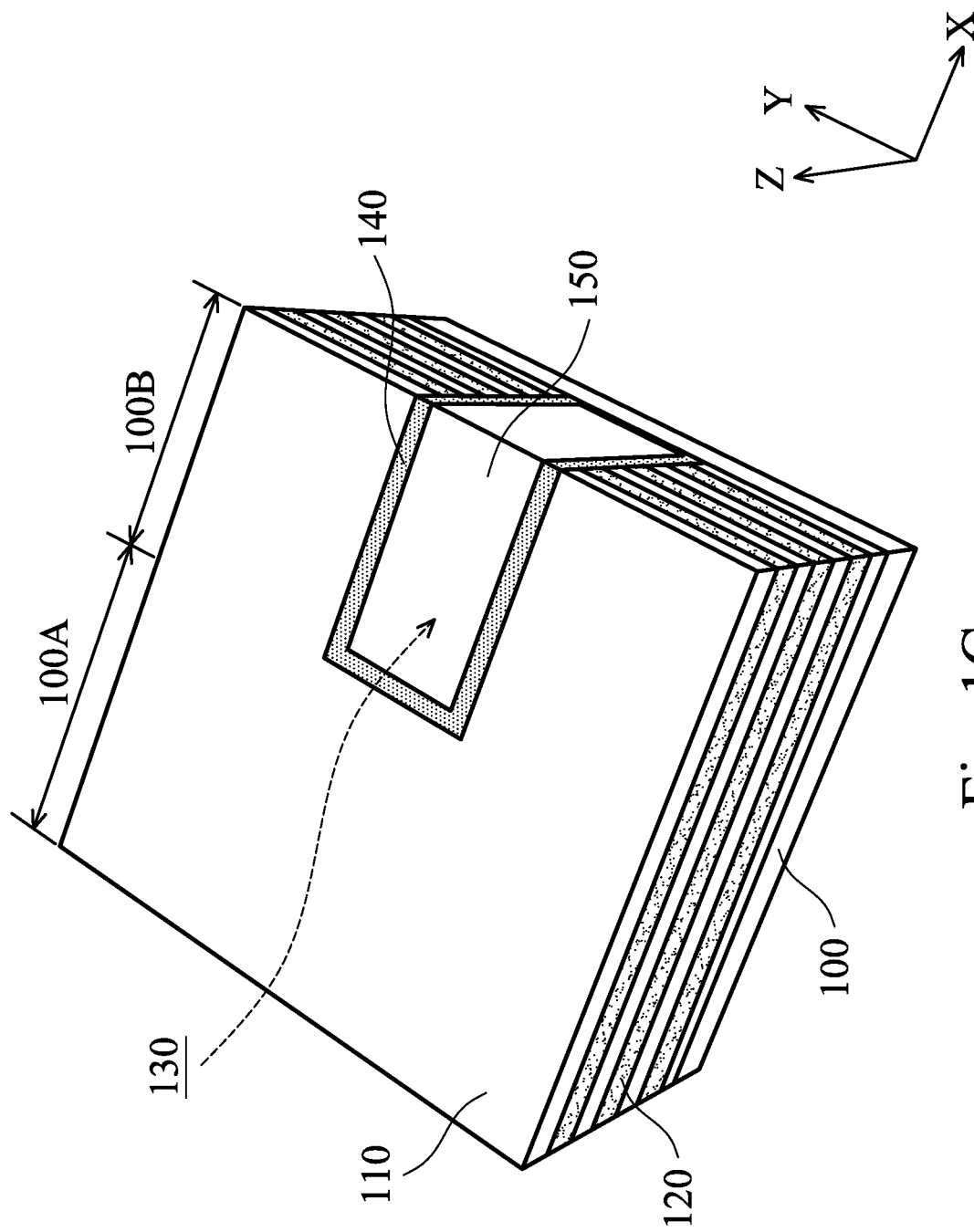

As shown in FIG. 1C, an adhesive layer 140 is deposited in the trenches 130 in the regions 100B, in accordance with some embodiments. In some embodiments, the adhesive layer 140 is conformally deposited on the sidewalls and the bottom surface of the trenches 130. In some embodiments, the adhesive layer 140 adjoins the side surfaces of the dielectric layers 110 and the semiconductor layers 120 that are exposed through the trenches 130. In some embodiments, the adhesive layer 140 covers the exposed portion of the semiconductor substrate 100.

In some embodiments, the adhesive layer 140 includes oxide (such as silicon oxide), nitride, another suitable adhesive material, or a combination thereof. In some embodiments, the adhesive layer 140 has a multi-layer structure. For example, the adhesive layer 140 may include a nitride layer and an oxide layer. The oxide layer is sandwiched between the nitride layer and the semiconductor layers 120, and between the nitride layer and the dielectric layers 110. In some embodiments, the adhesive layer 140 is deposited using a CVD process, a spray coating process, a spin-on process, another applicable process, or a combination thereof.

As shown in FIG. 1C, a dielectric layer 150 is deposited in the trenches 130 in the regions 100B, in accordance with some embodiments. As a result, the adhesive layer 140 and the dielectric layer 150 together fill up the trenches 130. In some embodiments, the adhesive layer 140 and the dielectric layer 150 are surrounded by the dielectric layers 110 and the semiconductor layers 120. In some embodiments, a portion of the adhesive layer 140 is sandwiched between the dielectric layers 110 and the dielectric layer 150. In some embodiments, a portion of the adhesive layer 140 is sandwiched between the semiconductor layers 120 and the dielectric layer 150.

In some embodiments, the dielectric layer 150 includes oxide, nitride, another suitable material, or a combination thereof. For example, the dielectric layer 150 may include aluminum oxide, silicon oxide, silicon nitride, silicon carbonitride, silicon oxycarbide, or another suitable dielectric material. In some embodiments, the material of the dielectric layer 150 is different from that of the dielectric layers 110.

In some embodiments, the dielectric layer 150 is deposited using a CVD process, a spray coating process, a spin-on process, an ALD process, a PVD process, another applicable process, or a combination thereof. In some embodiments, the deposited adhesive layer 140 and the deposited dielectric layer 150 covers the topmost of the dielectric layers 110 in the regions 100A and the regions 100B (not shown). A planarization process is subsequently performed to thin down the deposited adhesive layer 140 and the deposited dielectric layer 150 until the topmost of the dielectric layers 110 is exposed. The planarization process may include a chemical mechanical polishing (CMP) process, a grinding process, an etching process, another applicable process, or a combination thereof.

Figure 1D:
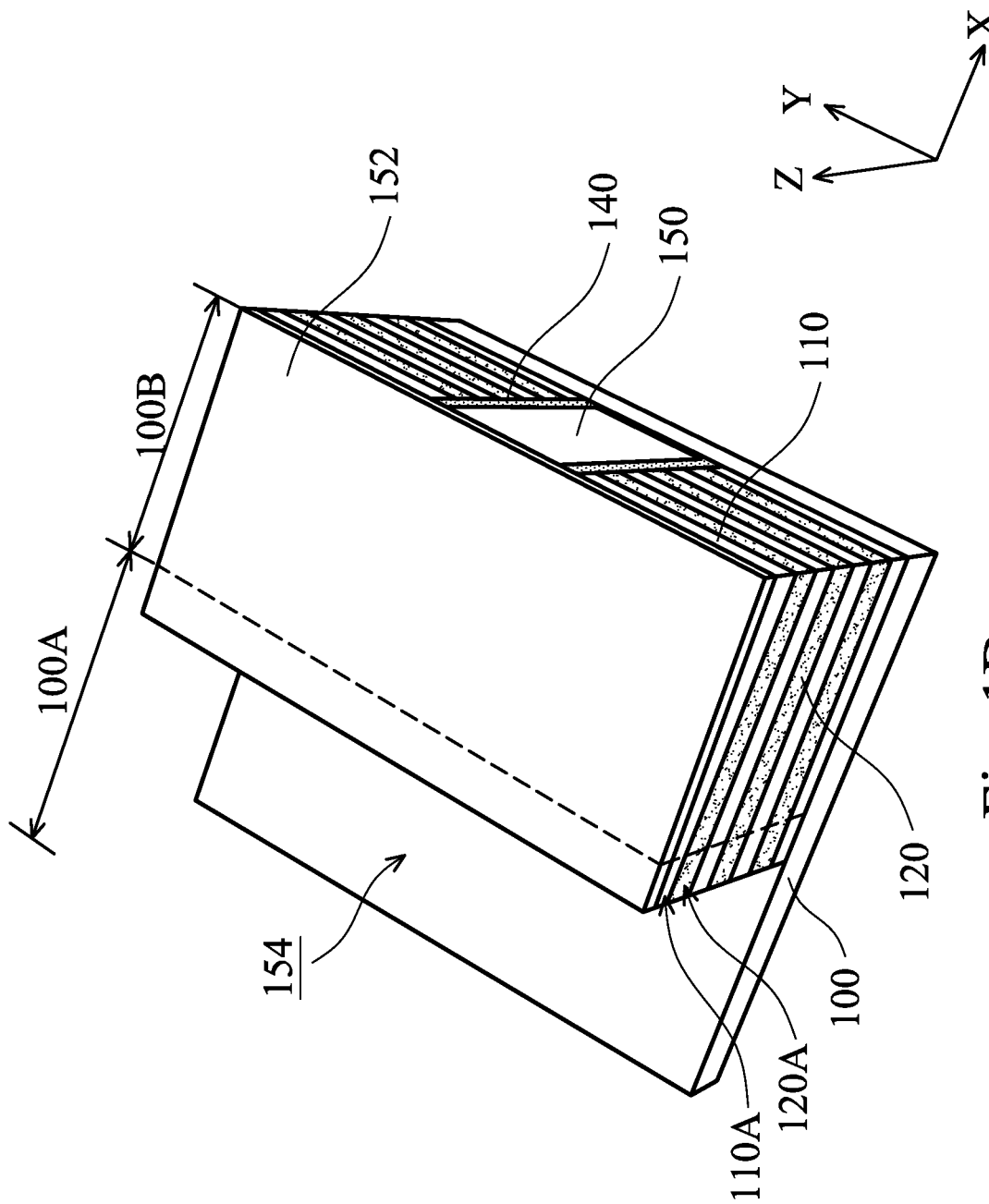

As shown in FIG. 1D, a patterned mask layer 152 is formed over the topmost of the dielectric layers 110, in accordance with some embodiments. The patterned mask layer 152 covers the regions 100B and has openings 154 partially exposing the regions 100A. One of the openings 154 is shown in FIG. 1D.

Afterwards, the dielectric layers 110 and the semiconductor layers 120 in the regions 100A exposed by the openings 154 are removed. As a result, the semiconductor substrate 100 is partially exposed. Each of the dielectric layers 110 has a remaining portion 110A in the regions 100A and each of the semiconductor layers 120 has the remaining portion 120A in the regions 100A. The boundary between the regions 100A and the regions 100B is illustrated as a dashed line for a better understanding of the structure. In some embodiments, multiple etching processes are used to partially remove the dielectric layers 110 and the semiconductor layers 120 in the regions 100A. The patterned mask layer 152 is removed after the etching processes.

Figure 1E:
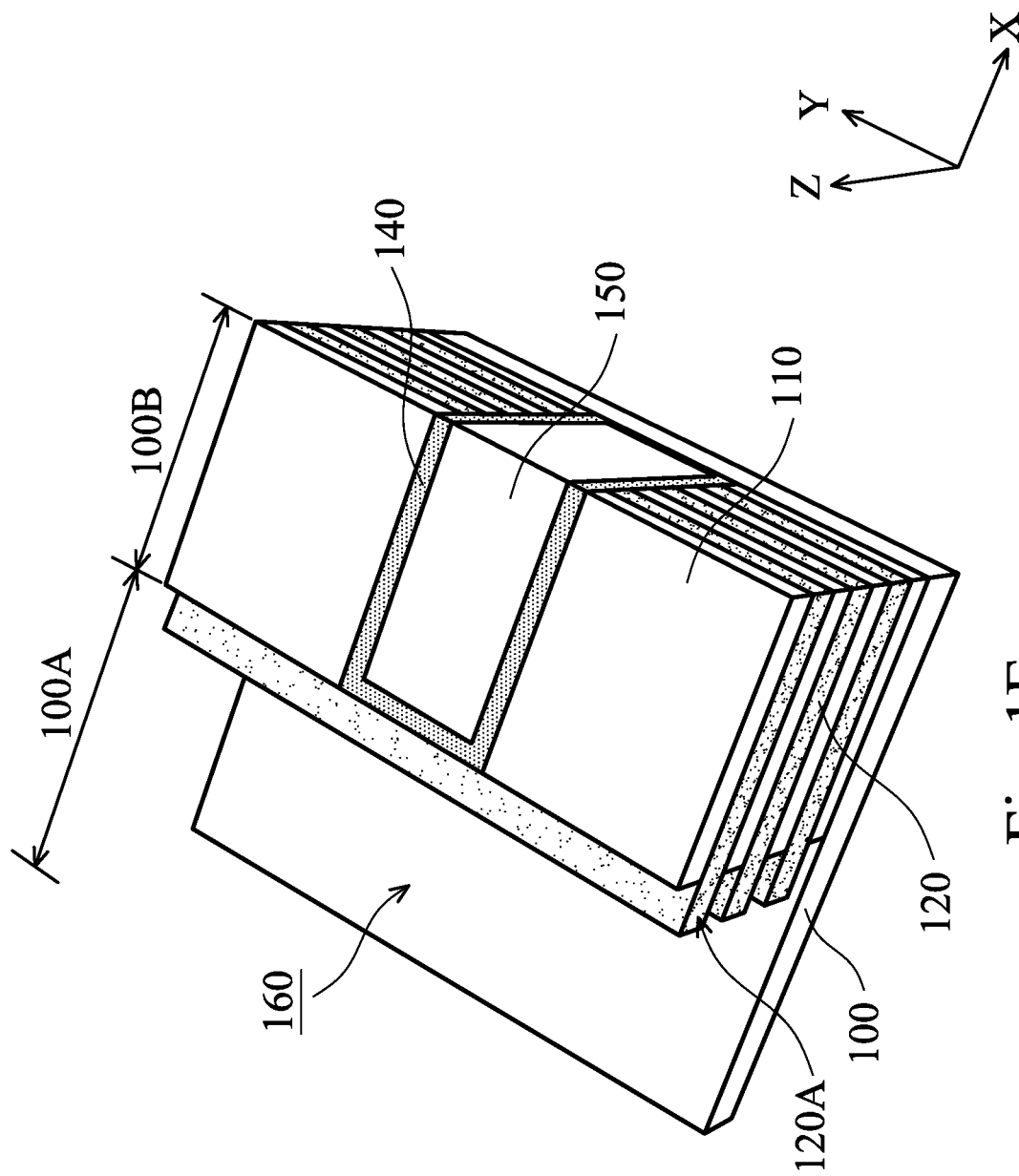

As shown in FIG. 1E, the portion 110A of the dielectric layers 110 in the regions 100A is removed, in accordance with some embodiments. As a result, multiple trenches (or recesses) 160 are formed in the regions 100A. One of the trenches 160 is shown in FIG. 1E. The trenches 160 create space for a subsequently formed dielectric layer. In some embodiments, the trenches 160 penetrate through the dielectric layers 110 and the semiconductor layers 120 and expose the semiconductor substrate 100 in the regions 100A.

In some embodiments, an etching process is used to remove the portion 110A of the dielectric layers 110 in the regions 100A. In some embodiments, the etchant for removing the portion 110A of the dielectric layers 110 has a sufficiently high etch selectivity of the dielectric layers 110 to the portion 120A of the semiconductor layers 120. As a result, the portion 110A is etched much faster than the portion 120A. Accordingly, it is easier to cleanly remove the portion 110A without residue and without damaging the semiconductor layers 120.

As mentioned above, the material of the dielectric layer 150 is different from that of the dielectric layers 110, in accordance with some embodiments. In some embodiments, an etchant used in the etching process for forming the trenches 160 has a sufficiently high etch selectivity of the dielectric layers 110 to the dielectric layer 150. As a result, the dielectric layers 110 are etched much faster than the dielectric layer 150 during formation of the trenches 160. For example, in some embodiments, the dielectric layers 110 in the regions 100A are removed to form the trenches 160 while the dielectric layer 150 in the regions 100B is substantially not removed. The trenches 160 are forced to be formed at specific positions relative to the dielectric layer 150 in the regions 100B. As a result, the trenches 160 are positioned in the regions 100A without being in the regions 100B. Accordingly, the high selective etching process creates the self-aligned trenches 160 and achieves precise alignment between the trenches 160 and the regions 100A.

As shown in FIG. 1E, the portion 110A of the dielectric layers 110 under the portion 120A of the semiconductor layers 120 is removed from the regions 100A, in accordance with some embodiments. In some embodiments, there is substantially no dielectric layer 110 remaining in the regions 100A so that the portion 120A of the semiconductor layers 120 has no support in the regions 100A. The portion 120A of the semiconductor layers 120 is suspended or hung in the regions 100A, as shown in FIG. 1E. In some embodiments, the portion 120A of the semiconductor layers 120 is attached and fixed to the dielectric layer 150 in the regions 100B through the adhesive layer 140. As a result, the portion 120A of the semiconductor layers 120 is prevented from shifting and bending during subsequent processes, which will be described in more detail later.

Figure 1F:
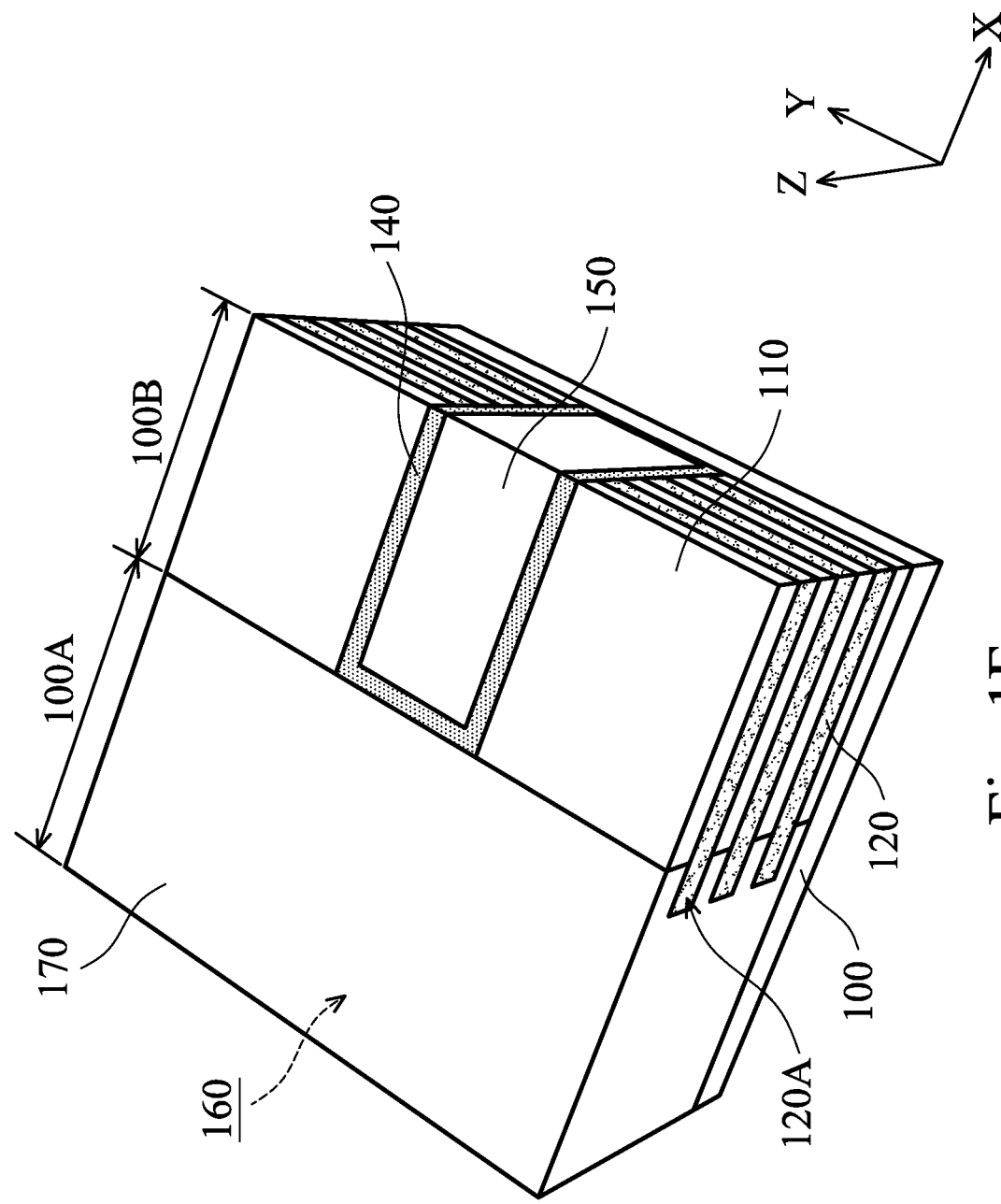

As shown in FIG. 1F, a dielectric layer 170 is deposited over the semiconductor substrate 100 in the regions 100A, in accordance with some embodiments. The dielectric layer 170 fills up the trenches 160. As a result, the portion 120A of the semiconductor layers 120 in the regions 100A is embedded in the dielectric layer 170. In some embodiments, the portion 120A of the semiconductor layers 120 is partially covered by the dielectric layer 170. For example, the portion 120A of the semiconductor layers 120 has three surfaces covered by the dielectric layer 170 and one surface covered by the adhesive layer 140 and the dielectric layer 150.

In some embodiments, the dielectric layer 170 includes oxide, nitride, another suitable material, or a combination thereof. For example, the dielectric layer 170 may include aluminum oxide, silicon oxide, silicon nitride, silicon carbonitride, silicon oxycarbide, or another suitable dielectric material. In some embodiments, the material of the dielectric layer 170 is different from that of the dielectric layers 110. In some embodiments, the material of the dielectric layer 170 is different from that of the dielectric layer 150. In accordance with some embodiments, the materials of the dielectric layers 110, the dielectric layer 150 and the dielectric layer 170 are selected to have sufficiently high selectivity during subsequent etching processes, which will be described in more detail later.

In some embodiments, the dielectric layer 170 is deposited using a CVD process, a spray coating process, a spin-on process, an ALD process, a PVD process, another applicable process, or a combination thereof. As mentioned above, the portion 120A of the semiconductor layers 120 is securely attached to the dielectric layer 150 through the adhesive layer 140. Accordingly, the portion 120A of the semiconductor layers 120 is not shifted or bent during the deposition of the dielectric layer 170.

Figure 1G:
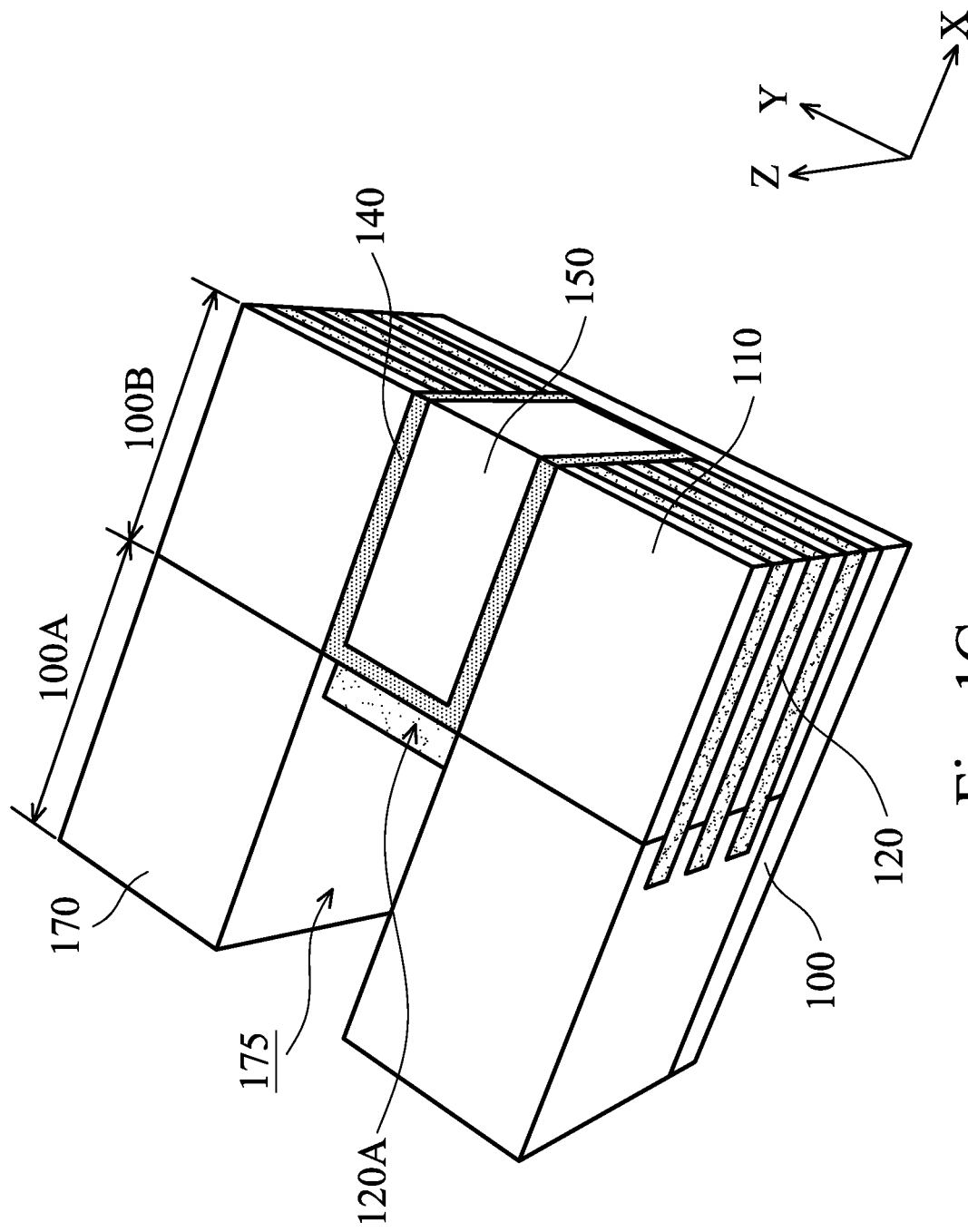

Afterwards, multiple trenches (or recesses) 175 are formed in the dielectric layer 170 in the regions 100A, in accordance with some embodiments. As a result, space is created for subsequently formed gate stacks. One of the trenches 175 is shown in FIG. 1G.

In some embodiments, the trenches 175 penetrate through the dielectric layer 170 and expose the semiconductor substrate 100 in the regions 100A. In some embodiments, the portion 120A of the semiconductor layers 120 is partially exposed through the trenches 175. In some embodiments, the adhesive layer 140 in the regions 100B is partially exposed through the trenches 175. In some embodiments, the width of one of the trenches 175 is substantially equal to that of one of the trenches 130 shown in FIG. 1B. The width of the trenches 175 may be measured along a direction that is substantially parallel to the Y-axis shown in FIG. 1B or the boundary between the dielectric layer 170 in the regions 100A and the dielectric layers 110 in the regions 100B. The width of the trenches 130 shown in FIG. 1B may be measured along a direction that is substantially parallel to the Y-axis shown in FIG. 1B or the boundary between the regions 100A and the regions 100B.

The size of the trenches 175 and the trenches 130 may be varied to meet requirements. For example, in some other embodiments, the width of one of the trenches 130 shown in FIG. 1B is greater than that of one of the trenches 175. As a result, the dielectric layer 150 formed in one of the trenches 130 is wider than a subsequently formed gate stack in one of the trenches 175. The wider dielectric layer 150 provides further electrical isolation between the subsequently formed gate stack and subsequently formed contact structures. The contact structures will be described in more detail later.

In some embodiments, photolithography and etching processes are performed to form the trenches 175. In some embodiments, a patterned mask layer (not shown) is used to assist in the formation of the trenches 175. For example, the patterned mask layer covers the regions 100B and partially exposes the regions 100A to define the positions of the trenches 175.

As mentioned above, the material of the dielectric layer 170 is different from that of the dielectric layers 110 and the dielectric layer 150, in accordance with some embodiments. In some embodiments, an etchant used in the etching process for forming the trenches 175 has a sufficiently high etch selectivity of the dielectric layer 170 to the dielectric layers 110. In some embodiments, the etchant used in the etching process for forming the trenches 175 has a sufficiently high etch selectivity of the dielectric layer 170 to the dielectric layer 150. As a result, the dielectric layer 170 is etched much faster than the dielectric layers 110 and the dielectric layer 150 during formation of the trenches 175.

For example, in some embodiments, the dielectric layer 170 in the regions 100A are partially removed to form the trenches 175 while the dielectric layers 110 and the dielectric layer 150 in the regions 100B are substantially not removed. The trenches 175 are forced to be formed at specific positions relative to the dielectric layers 110 and the dielectric layer 150. As a result, the trenches 175 are positioned in the regions 100A without being in the regions 100B. Accordingly, the high selective etching process creates the self-aligned trenches 175. The high selective etching process eliminates the need to align the trenches 175 to the regions 100A and achieves precise alignment between the trenches 175 and the regions 100A.

In some embodiments, a patterned mask layer having openings in the regions 100A (not shown) is used to define the positions of the trenches 175. The patterned mask layer covers the dielectric layers 110 and the dielectric layer 150 in the regions 100B. The openings of the patterned mask layer expose the dielectric layer 170 in the regions 100A. If the patterned mask layer shifts, the openings may partially expose the dielectric layers 110 and/or the dielectric layer 150 in the regions 100B. Since the dielectric layers 110 and the dielectric layer 150 are substantially not removed during the etching process for forming the trenches 175, the trenches 175 are forced to be formed at specific positions in the regions 100A. Therefore, even if the patterned mask layer defining the positions of the trenches 175 shifts in a way that is not desired, it can be ensured that the trenches 175 are accurately formed in the regions 100A.

Figure 1H:
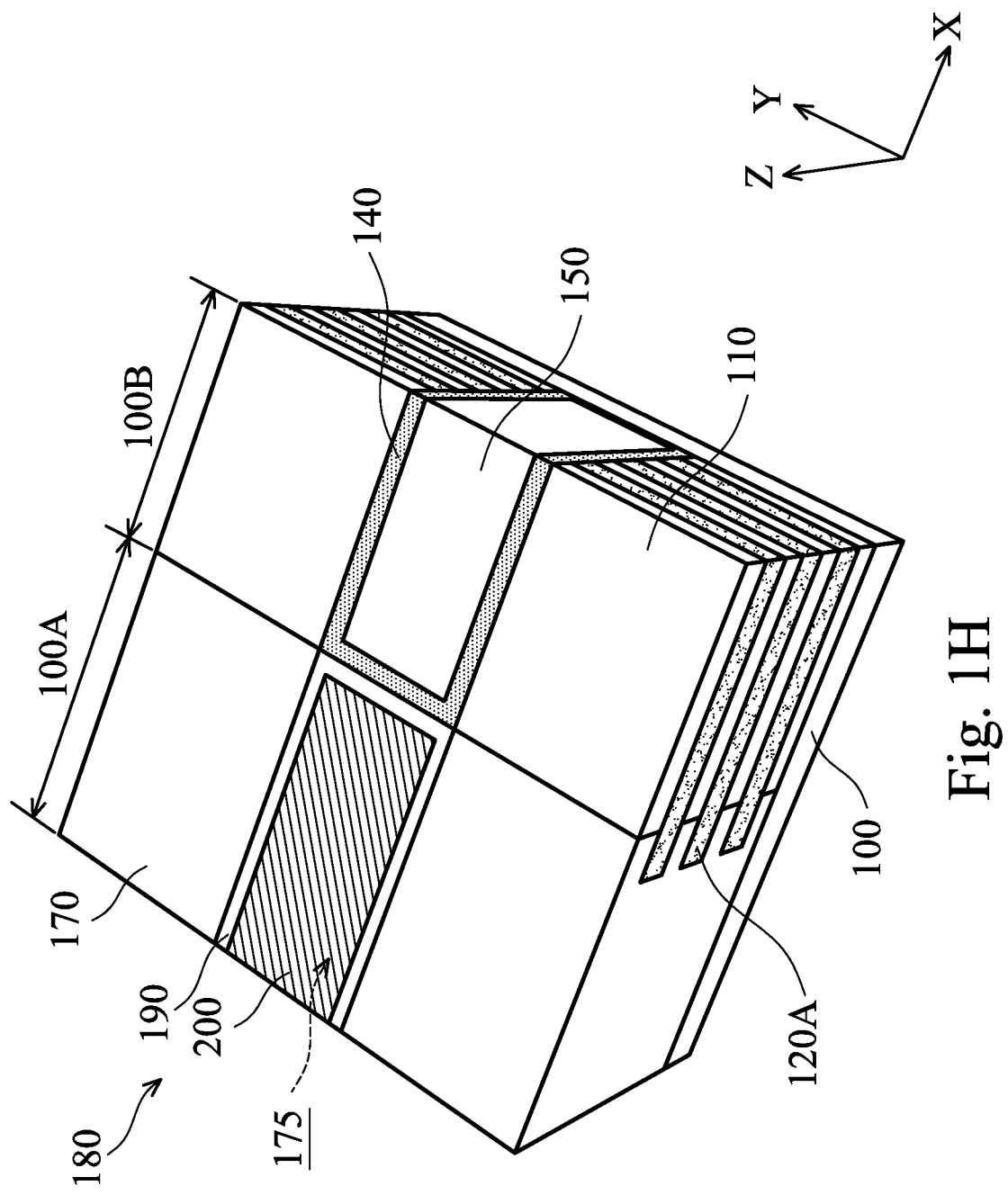

Subsequently, multiple sacrificial (or dummy) gate stack structures 180 are formed in the recesses 175 of the dielectric layer 170, in accordance with some embodiments. One of the gate stack structures 180 is shown in FIG. 1H. The gate stack structures 180 will be replaced with other gate stacks, which will be described in more detail later.

In some embodiments, the gate stack structures 180 partially encircle the exposed portion 120A of the semiconductor layers 120. For example, the portion 120A has three surfaces covered by the gate stack structures 180 and one surface covered by the adhesive layer 140 and the dielectric layer 150. In some embodiments, the gate stack structures 180 adjoin the adhesive layer 140 in the regions 100B.

As shown in FIG. 1H, one of the gate stack structures 180 includes a sacrificial (or dummy) gate dielectric layer 190 and a sacrificial (or dummy) gate electrode 200, in accordance with some embodiments. The gate dielectric layer 190 and the gate electrode 200 together fill up the recesses 175 of the dielectric layer 170. In some embodiments, a portion of the gate dielectric layer 190 is sandwiched between the gate electrode 200 and the adhesive layer 140. In some embodiments, a portion of the gate dielectric layer 190 is sandwiched between the gate electrode 200 and the exposed portion 120A of the semiconductor layers 120.

In some embodiments, the gate dielectric layer 190 is made of a dielectric material. For example, the gate dielectric layer 190 is made of silicon oxide or another suitable material. In some embodiments, the gate dielectric layer 190 is deposited using a CVD process, an ALD process, a PVD process, a spin-on process, another applicable process, or a combination thereof. In some embodiments, the gate electrode 200 is made of polysilicon or another suitable material. In some embodiments, the gate electrode 200 is deposited using a CVD process, an ALD process, a PVD process, another applicable process, or a combination thereof.

Figure 1I:
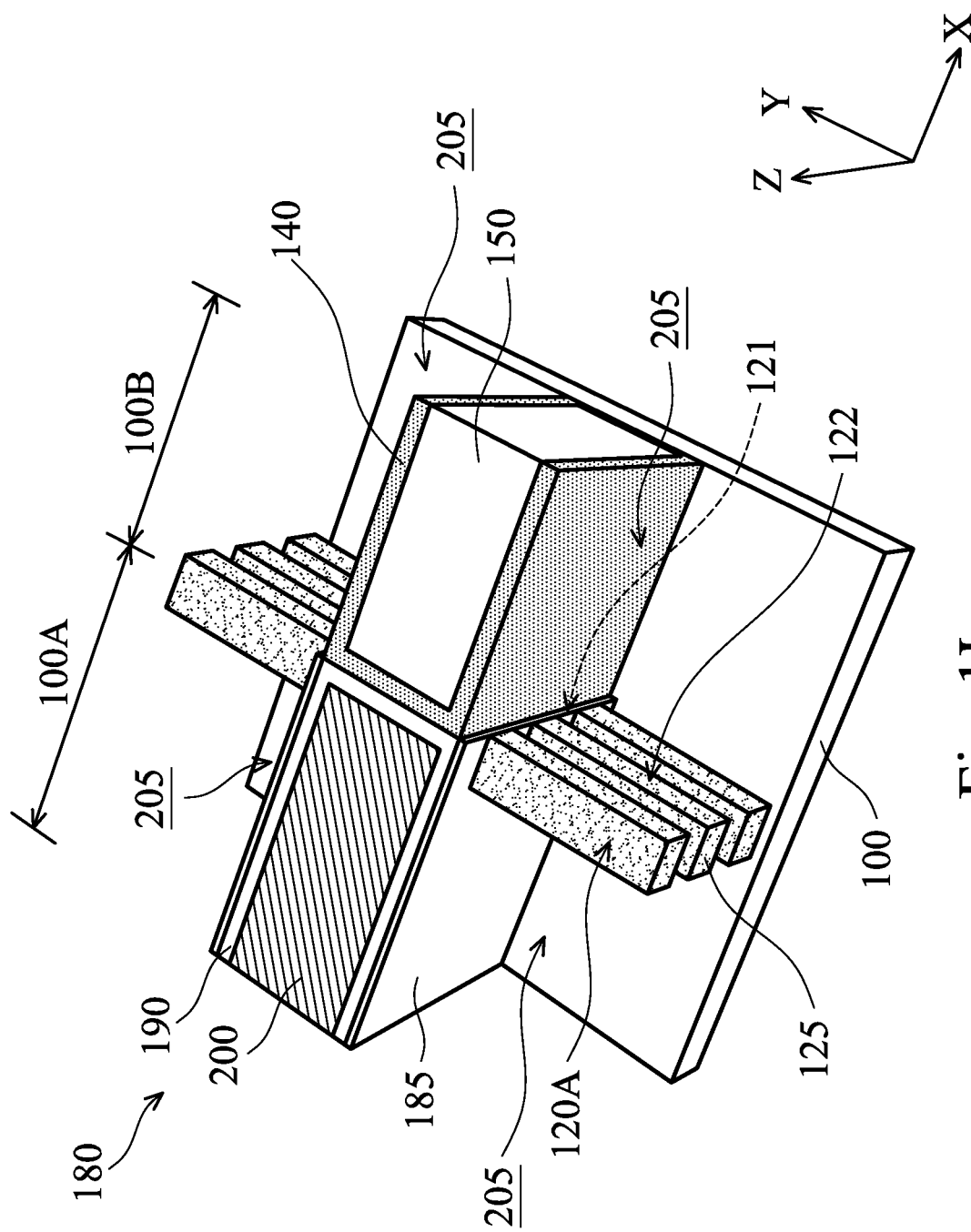

As shown in FIG. 1I, the dielectric layer 170 in the regions 100A and the dielectric layers 110 and the semiconductor layers 120 in the regions 100B are removed, in accordance with some embodiments. As a result, recesses 205 are formed. The recesses 205 expose the semiconductor substrate 100 in the regions 100A and the regions 100B. In some embodiments, multiple photolithography processes and etching processes are performed to form the recesses 205.

As described above, the semiconductor layers 120 are patterned multiple times, in accordance with some embodiments. The semiconductor layers 120 in the regions 100A are partially removed to form the trenches 160, as shown in FIG. 1D. Subsequently, the semiconductor layers 120 in the regions 100B are removed to form the recesses 205, as shown in FIG. 1I. After the formation of the trenches 160 and the recesses 205, the portion 120A of the semiconductor layers 120 remains in the regions 100A. As a result, multiple semiconductor wires 125 are formed in the regions 100A after the multi-patterning of the semiconductor layers 120. The semiconductor wires 125 may be referred to as nanowires.

As shown in FIG. 1I, each of the semiconductor wires 125 has a portion 121, which is covered by the gate stack structures 180, and portions 122, which are exposed through the recesses 205. The portion 121 of the semiconductor wires 125 may serve as a channel region of a field effect transistor (FET). The portions 122 of the semiconductor wires 125 may serve as source/drain regions of a FET. The source/drain regions may be used to provide stress or strain to the channel region. In some embodiments, the portions 122 of the semiconductor wires 125 have no support so that the portions 122 of the semiconductor wires 125 are suspended or hung in the regions 100A.

In some embodiments, the gate stack structures 180 in the regions 100A and the dielectric layer 150 in the regions 100B are positioned on opposite sides of the semiconductor wires 125. Different from the dielectric layer 150, the gate stack structures 180 surround the semiconductor wires 125. As a result, the semiconductor wires 125 are partially encircled by the gate stack structures 180. The semiconductor wires 125 may have multiple surfaces covered by the gate stack structures 180. In some embodiments, the semiconductor wires 125 have three surfaces covered by the gate stack structures 180. In some embodiments, the semiconductor wires 125 have one surface covered by the dielectric layer 150 and in direct contact with the adhesive layer 140.

Afterwards, spacer elements 185 are formed on the sidewalls of the gate stack structures 180, as shown in FIG. 1I in accordance with some embodiments. The spacer elements 185 partially wrap around the semiconductor wires 125. In some embodiments, the semiconductor wires 125 are partially exposed during the formation of the spacer elements 185.

In some embodiments, the spacer elements 185 are made of a dielectric material. The dielectric material may include silicon nitride, silicon oxynitride, silicon carbon nitride, silicon carbide, another suitable dielectric material, or a combination thereof. In some embodiments, the dielectric material is deposited using a CVD process, a PVD process, a spin-on process, another applicable process, or a combination thereof.

Figure 1J:
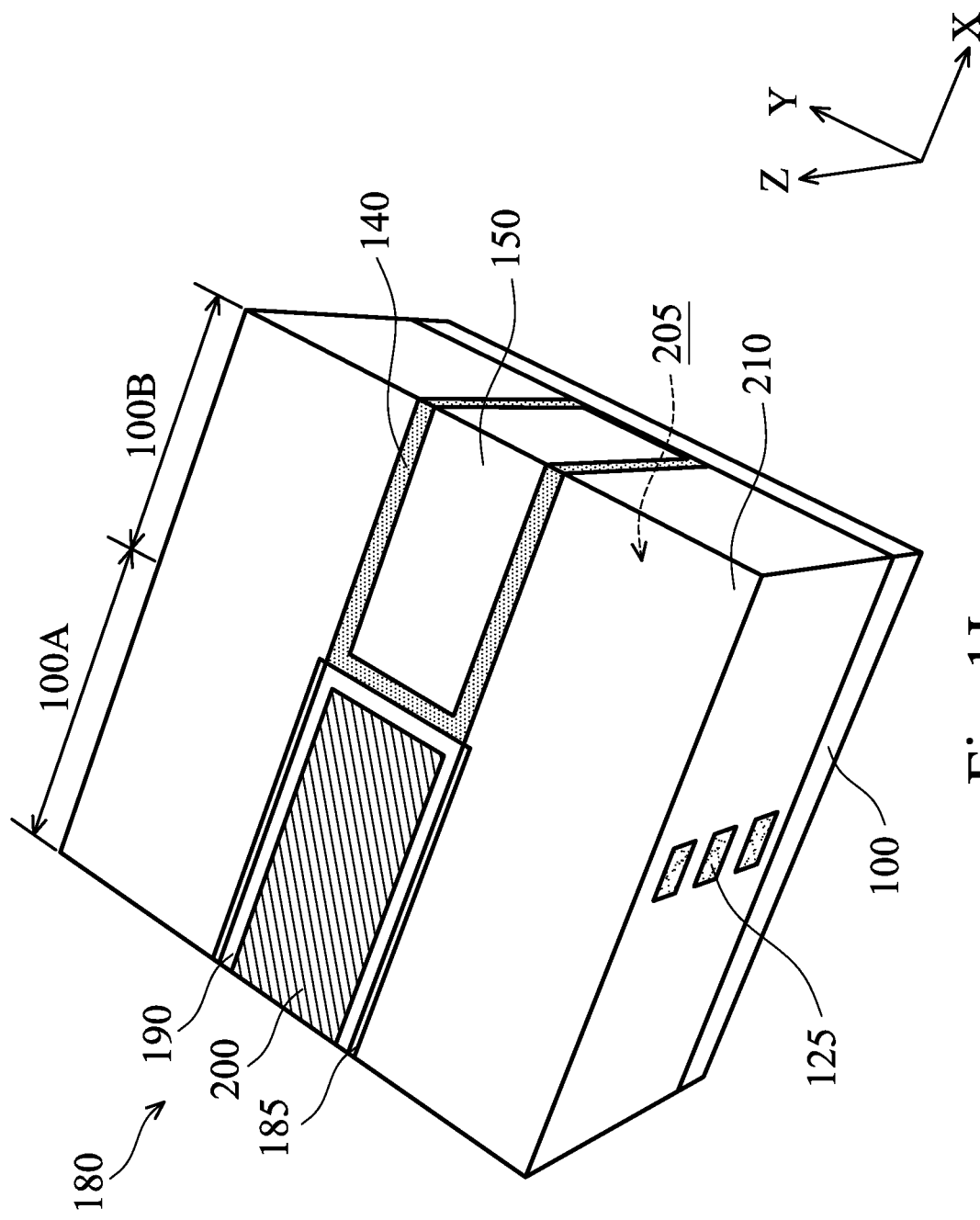

As shown in FIG. 1J, a dielectric layer 210 is deposited over the semiconductor substrate 100 in the regions 100A and the regions 100B, in accordance with some embodiments. The dielectric layer 210 fills up the recesses 205. As a result, the semiconductor wires 125, the gate stack structures 180 and the dielectric layer 150 are surrounded by the dielectric layer 210. The dielectric layer 210 may serve as an interlayer dielectric (ILD) layer of an interconnection structure. The material of the ILD layer may be selected to minimize size, propagation delays, and crosstalk between nearby conductive features.

In some embodiments, the dielectric layer 210 includes oxide, nitride, another suitable material, or a combination thereof. For example, the dielectric layer 210 may include aluminum oxide, silicon oxide, silicon nitride, silicon carbonitride, silicon oxycarbide, or another suitable dielectric material. In some embodiments, the material of the dielectric layer 210 is different from that of the dielectric layers 150. The material of the dielectric layer 210 may be the same as or different from that of the dielectric layer 110.

In some embodiments, the dielectric layer 210 is deposited using a CVD process, a spray coating process, a spin-on process, an ALD process, a PVD process, another applicable process, or a combination thereof. In some embodiments, the deposited dielectric layer 210 covers the gate stack structures 180 and the dielectric layer 150 (not shown). A planarization process is subsequently performed to thin down the deposited dielectric layer 210 until the gate stack structures 180 and the dielectric layer 150 are exposed. The planarization process may include a chemical mechanical polishing (CMP) process, a grinding process, an etching process, another applicable process, or a combination thereof.

Figure 1K:
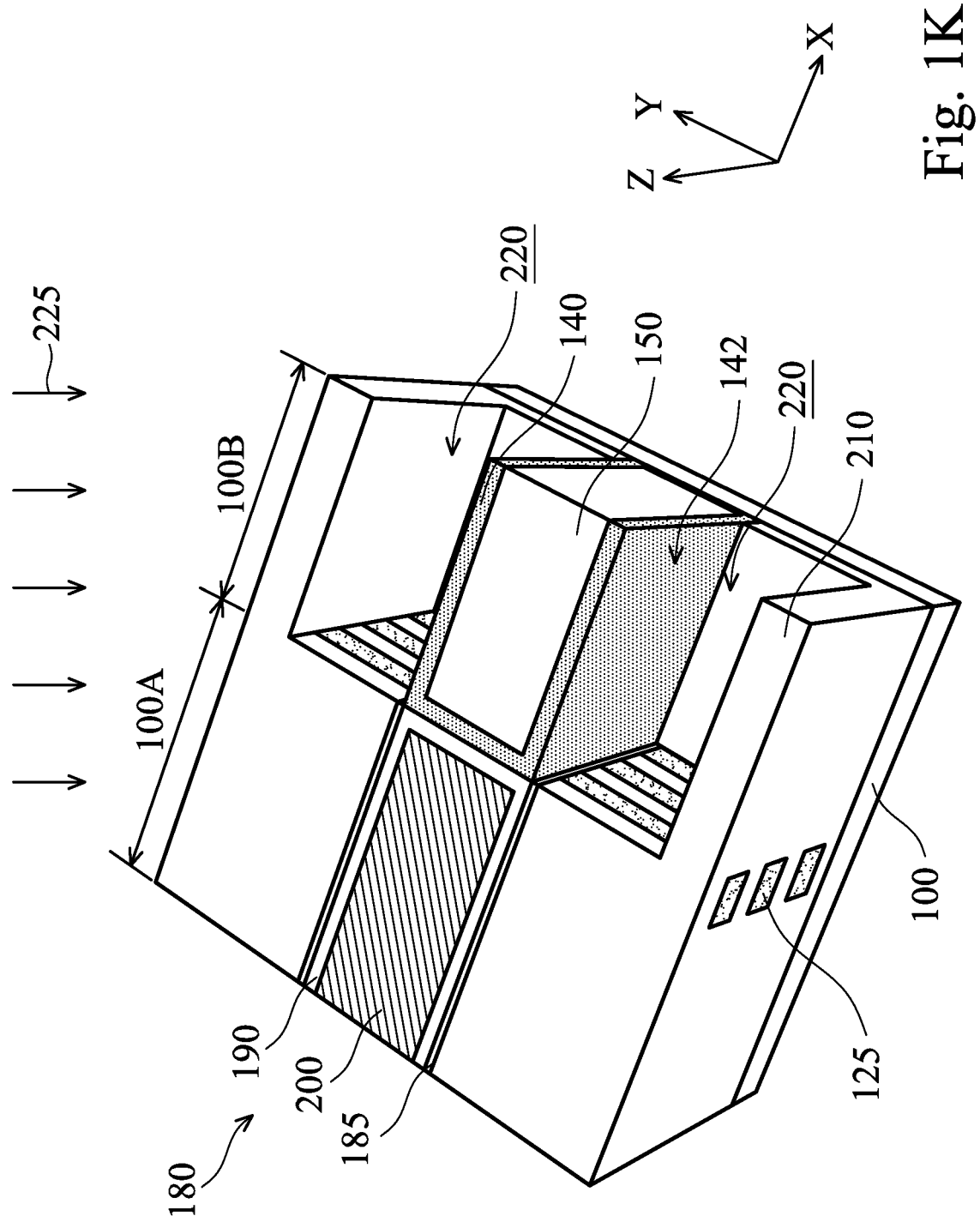

As shown in FIG. 1K, the dielectric layer 210 in the regions 100B is partially removed, in accordance with some embodiments. As a result, multiple trenches (or recesses) 220 are formed in the dielectric layer 210 in the regions 100B. Space is created for subsequently formed contact electrodes that are coupled to source/drain regions of a FET. In some embodiments, the trenches 220 expose a side surface of the semiconductor wires 125. In some embodiments, the trenches 220 are positioned on opposite sides of the dielectric layer 150 and expose side surfaces 142 of the adhesive layer 140.

In some embodiments, photolithography and etching processes are performed to form the trenches 220. In some embodiments, a patterned mask layer (not shown) is formed to assist in the formation of the trenches 220. For example, the patterned mask layer covers the regions 100A and partially exposes the regions 100B to define the positions of the trenches 220.

As mentioned above, the material of the dielectric layer 210 is different from that of the dielectric layer 150, in accordance with some embodiments. In some embodiments, an etchant used in the etching process for forming the trenches 220 has a sufficiently high etch selectivity of the dielectric layer 210 to the dielectric layer 150. As a result, the dielectric layer 210 is etched much faster than the dielectric layer 150 during formation of the trenches 220.

For example, in some embodiments, the dielectric layer 210 in the regions 100B is removed to form the trenches 220 while the dielectric layer 150 is substantially not removed. The trenches 220 are forced to be formed at specific positions relative to the dielectric layer 150. As a result, the trenches 220 are forced to be positioned on opposite sides of the dielectric layer 150. Accordingly, the high selective etching process creates the self-aligned trenches 220. The high selective etching process eliminates the need to align the trenches 220 to be formed on opposite sides of the dielectric layer 150.

In some embodiments, a patterned mask layer having openings in the regions 100B (not shown) is used to define the positions of the trenches 220. The patterned mask layer covers the regions 100A and the dielectric layer 150 in the regions 100B. The openings of the patterned mask layer expose the dielectric layer 210 in the regions 100B. If the patterned mask layer shifts, the openings may partially expose the dielectric layer 150 in the regions 100B. Since the dielectric layer 150 is substantially not removed during the etching process for forming the trenches 220, the trenches 220 are forced to be formed at specific positions relative to the dielectric layer 150. As a result, the trenches 220 are precisely positioned on opposite sides of the dielectric layer 150. Therefore, even if the patterned mask layer defining the positions of the trenches 220 shifts in a way that is not desired, it can be ensured that the trenches 220 are accurately formed in the predetermined positions.

One or more additional operations 225 can be provided after formation of the trenches 220. In some embodiments, the additional operations 225 include an epitaxial growth process. In accordance with some embodiments, an epitaxial growth process is performed over the structure shown in FIG. 1K. As a result, source/drain regions of a FET may be expanded after the epitaxial growth process. The epitaxial growth process may include a SEG process, a CVD process (e.g., a VPE process, a LPCVD process, and/or an UHV-CVD process), a molecular beam epitaxy process, another applicable process, or a combination thereof.

For example, cladding layers may be deposited over portions of the semiconductor wires 125 exposed through the trenches 220 during the epitaxial growth process. As a result, the semiconductor wires 125 and the cladding layers thereon may together form source/drain regions of a FET. In some embodiments, the cladding layers include silicon, germanium, silicon germanium, germanium tin, silicon germanium tin, or another suitable semiconductor material. The cladding layers and the semiconductor wires 125 may include different materials or the same material.

Although FIG. 1K shows that the semiconductor wires 125 have a rectangular or square cross-sectional profile, embodiments of the disclosure are not limited thereto. In some other embodiments, the cross-sectional profile of the semiconductor wires 125 is relatively rounded, circular, diamond, or another shape.

In some embodiments, the additional operations 225 include a thermal treatment. For example, a thermal treatment (such as an annealing process) is performed over the structure shown in FIG. 1K to shape the semiconductor wires 125, in accordance with some embodiments. During the thermal treatment, atoms in the semiconductor wires 125 may be rearranged. In some embodiments, the rearrangement of the atoms causes the corners of the semiconductor wires 125 to be rounded. As a result, the semiconductor wires 125 may have a curved surface.

In some embodiments, additional operations 225 including an epitaxial growth process and a thermal treatment are performed over the structure shown in FIG. 1K. Many variations and/or modifications can be made to embodiments of the disclosure. Some of the additional operations 225 that are described can be replaced or eliminated for different embodiments.

Figure 1L:
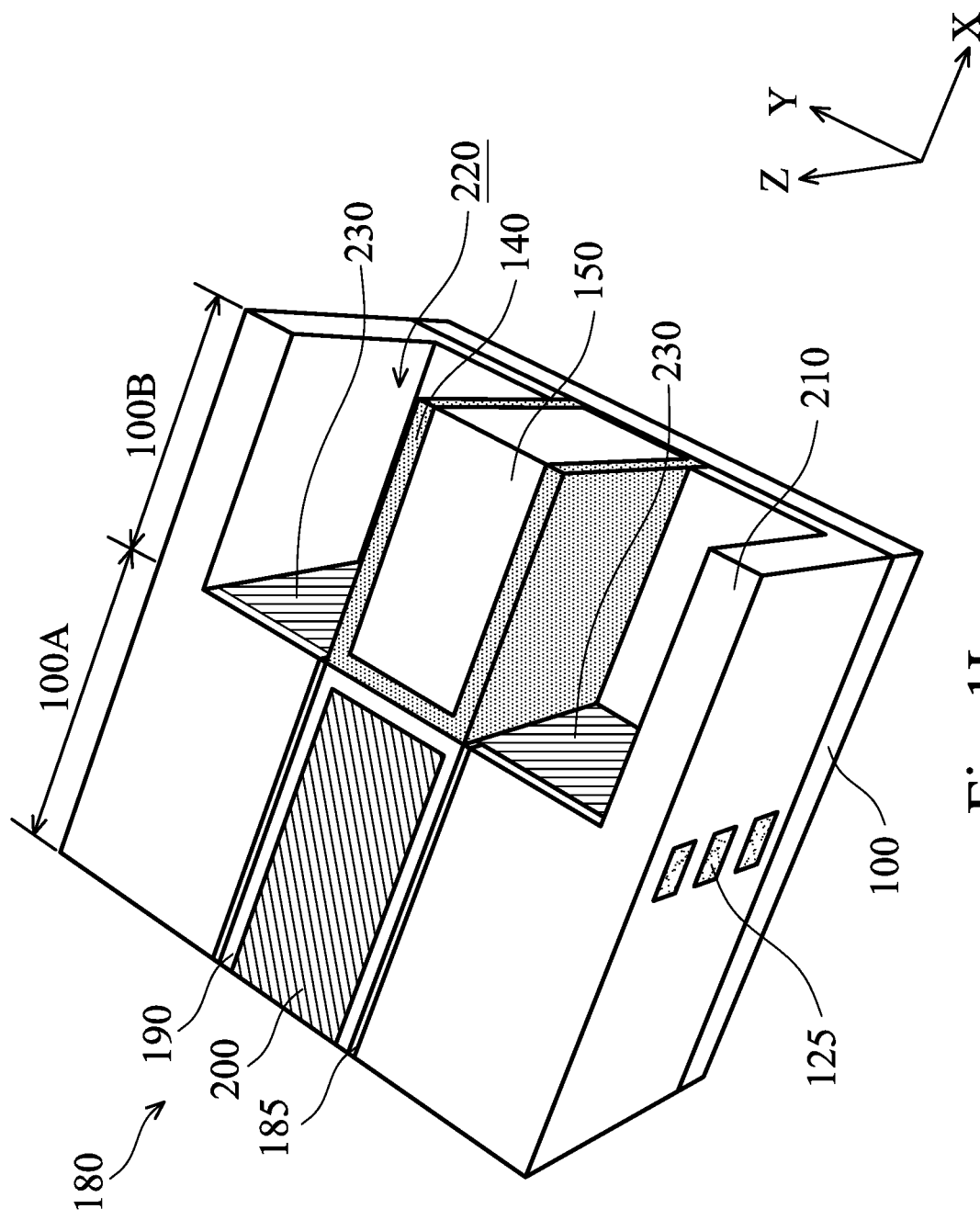

As shown in FIG. 1L, multiple silicide structures 230 are formed in the trenches 220, in accordance with some embodiments. The silicide structures 230 cover the exposed surface(s) of the semiconductor wires 125. The silicide structures 230 may reduce the contact resistance and increase the conductivity of source/drain regions of a FET. As a result, suitable contact areas for electrical connection are formed.

In some embodiments, the silicide structures 230 include a metal material. The metal material may include titanium, nickel, cobalt, or another suitable material. In some embodiments, the silicide structures 230 include a combination of a semiconductor material of the semiconductor wires 125 and a metal material. For example, the silicide structures 230 may include titanium silicon, nickel silicon or cobalt silicon. In some embodiments, the metal material is deposited using a PVD process, a CVD process, another applicable process, or a combination thereof.

In some embodiments, the silicide structures 230 are formed using a self-aligned silicidation (salicidation) process. For example, the metal material is conformally deposited in the trenches 220. Afterwards, an annealing process may be performed to cause the diffusion of the metal material into the semiconductor wires 125. As a result, the silicide structures 230 are formed at the exposed surface(s) of the semiconductor wires 125. The annealing process does not cause the diffusion of the metal material into dielectric layers (such as the dielectric layer 210) so that there is substantially no silicide formed on dielectric layers. After the annealing process, a cleaning treatment may be applied to remove remaining and undiffused portions of the metal material. The resulting silicide structures 230 are self-aligned with the exposed surface(s) of the semiconductor wires 125. The silicide structures 230 may be referred to as self-aligned silicide (salicide) structures.

The salicidation process eliminates the need to align the silicide structures 230 to the semiconductor wires 125 and achieves spontaneous alignment between the silicide structures 230 and the semiconductor wires 125. In some embodiments, the formation of the silicide structures 230 does not require lithography patterning processes.

Figure 1M:
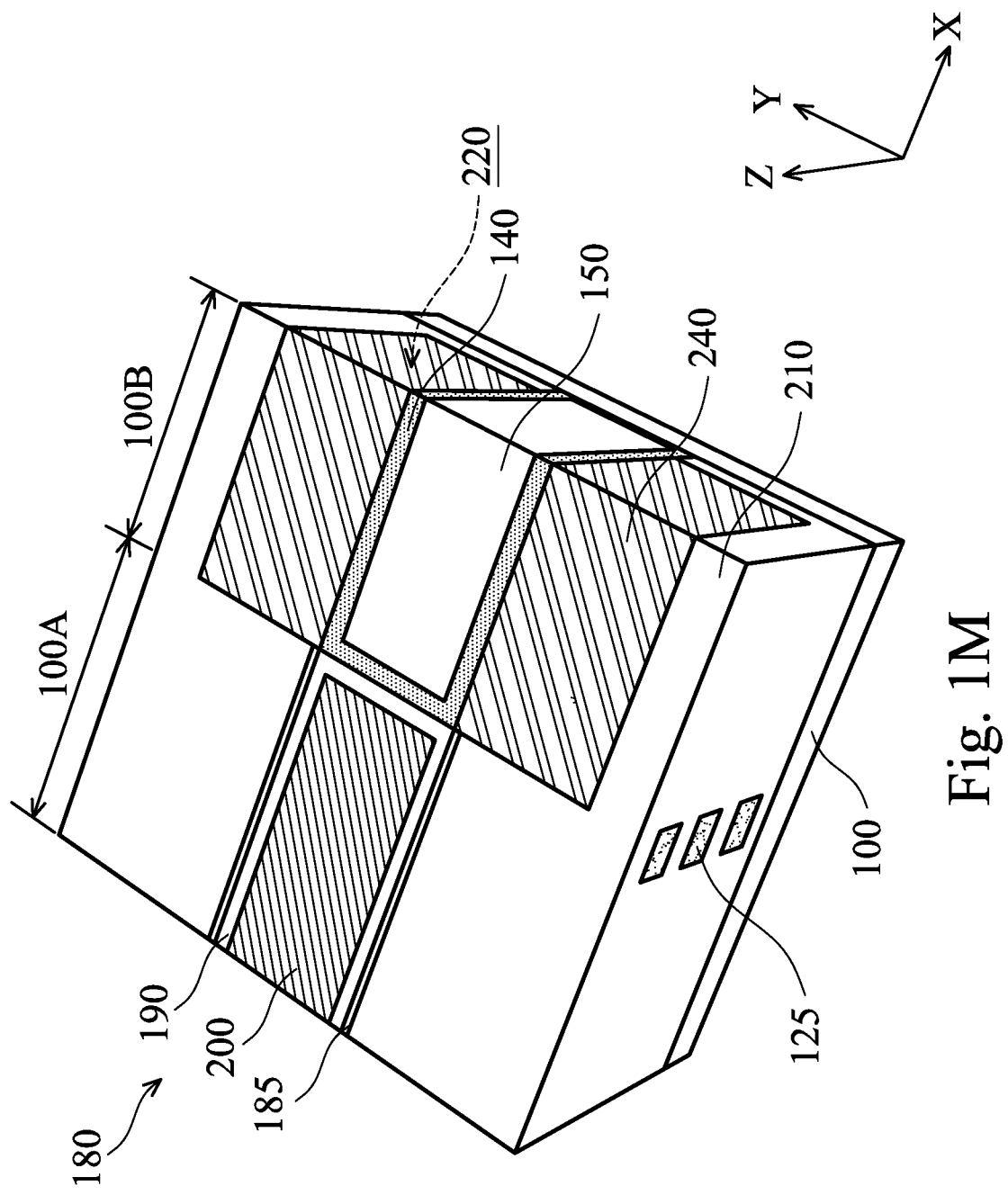
Figure 1N:
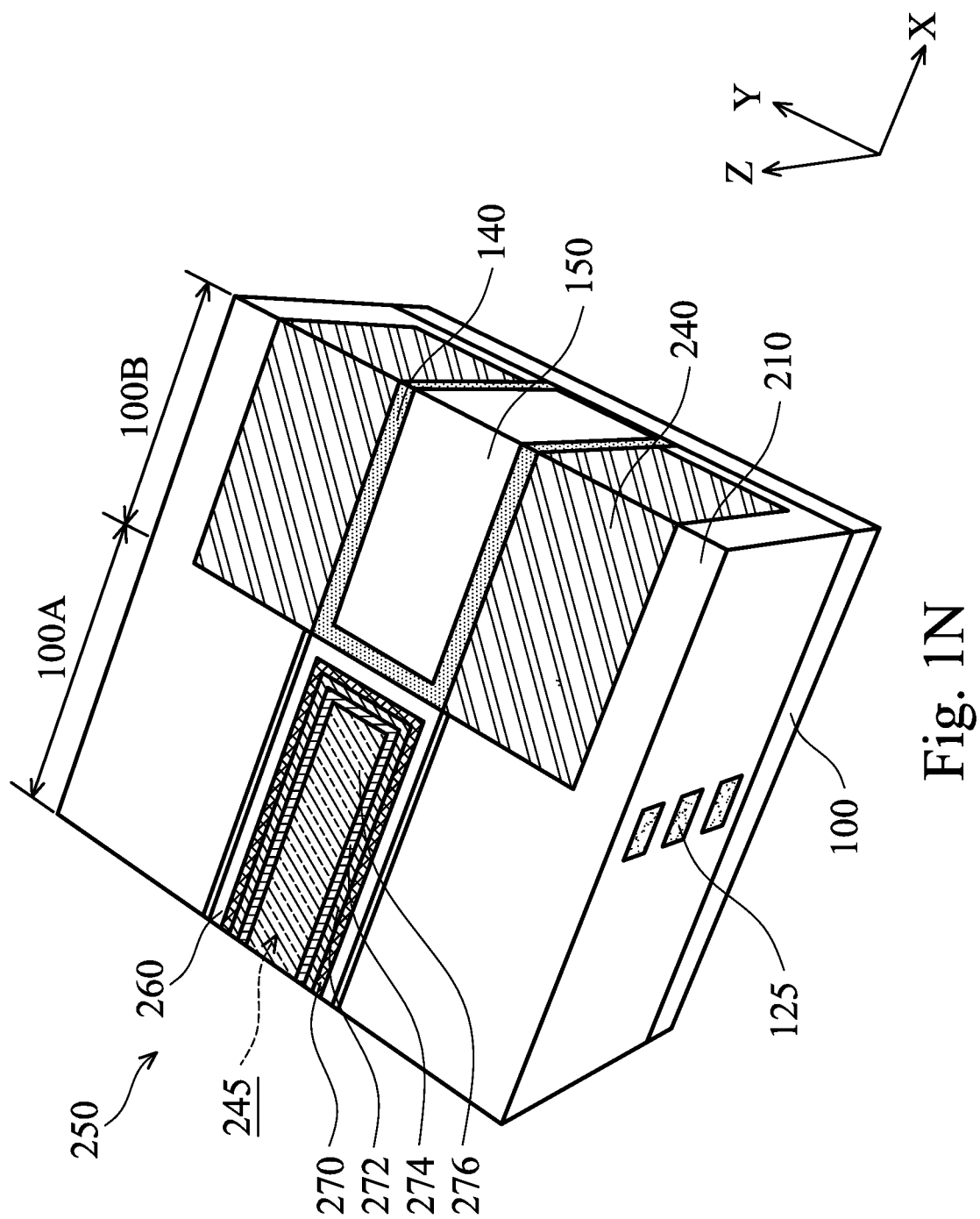

As shown in FIG. 1M, multiple contact structures 240 are formed in the trenches 220, in accordance with some embodiments. The contact structures 240 fill up the trenches 220. As a result, the silicide structures 230 and the contact structures 240 together form contact electrodes that are coupled to source/drain regions of a FET.

In some embodiments, the silicide structures 230 are sandwiched between the contact structures 240 and the semiconductor wires 125. Each of the contact structures 240 is electrically connected to the semiconductor wires 125 through the silicide structures 230. In some embodiments, the contact structures 240 are in direct contact with the spacer elements 185. In some embodiments, the contact structures 240 are in direct contact with the adhesive layer 140. In some embodiments, the dielectric layer 150 extends from the adhesive layer 140 along the contact structures 240.

In some embodiments, the contact structures 240 include a conductive material, such as tungsten, copper, aluminum, or another suitable conductive material. In some embodiments, the conductive material is deposited using an ALD process, a PVD process, a CVD process, an electroplating process, an electroless plating process, another applicable process, or a combination thereof. In some embodiments, the excessive conductive material is deposited outside of the trenches 220, and covers the dielectric layer 210. A planarization process is subsequently performed until the dielectric layer 210 is exposed so as to remove the excessive conductive material. As a result, the remaining portions of the conductive material in the trenches 220 form the contact structures 240. The planarization process may include a CMP process, a grinding process, an etching process, another applicable process, or a combination thereof.

As shown in FIG. 1N, the gate stack structures 180 are replaced with gate stack structures 250, in accordance with some embodiments. In some embodiments, the gate stack structures 180 are removed using a wet etching process, a dry etching process, another applicable process, or a combination thereof. As a result, trenches 245 are hollowed out in the dielectric layer 210 in the regions 100A. Afterwards, the gate stack structures 250 including a gate dielectric layer 260 and a metal gate electrode 270 are formed in the trenches 245. The gate dielectric layer 260 and the metal gate electrode 270 will be described in more detail later. The spacer elements 185 adjoin the sidewalls of the gate stack structures 250. The gate stack structures 250 may be referred to as metal gate stack structures.

In some embodiments, the gate stack structures 250 are electrically connected to the semiconductor wires 125. In some embodiments, the gate stack structures 250 are separated from the dielectric layer 150 by the adhesive layer 140. In some embodiments, the gate dielectric layer 260 is sandwiched between the metal gate electrode 270 and the dielectric layer 210 and between the metal gate electrode 270 and the adhesive layer 140. In some embodiments, the interface between the gate stack structures 250 and the adhesive layer 140 is substantially coplanar with that between the dielectric layer 210 and the contact structures 240, as shown in FIG. 1N.

In some embodiments, the contact structures 240, the adhesive layer 140 and the dielectric layer 150 extend in the regions 100B from the boundary between the regions 100A and the regions 100B along the X-axis, as shown in FIG. 1N. The contact structures 240 are on opposite sides of the dielectric layer 150 and overlap the dielectric layer 150. The gate stack structures 250 extend in the regions 100A from the adhesive layer 140 along the X-axis. Since the gate stack structures 250 do not extend in the regions 100B, the gate stack structures 250 in the regions 100A do not overlap the contact structures 240 in the regions 100B.

In some embodiments, the gate dielectric layer 260 includes a high-k material layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 260 is deposited using an ALD process, a CVD process, a spin-on process, another applicable process, or a combination thereof. In some embodiments, a high-temperature annealing operation is performed to reduce or eliminate defects in the gate dielectric layer 260.

In some embodiments, the gate dielectric layer 260 includes an interfacial layer (not shown) adjacent to the semiconductor wires 125. The interfacial layer may be used to reduce stress between the high-k material layer and the semiconductor wires 125. In some embodiments, the interfacial layer is made of silicon oxide. In some embodiments, the interfacial layer is formed using an ALD process, a thermal oxidation process, another applicable process, or a combination thereof. In some other embodiments, the gate dielectric layer 260 does not include the interfacial layer. In some embodiments, the gate dielectric layer 260 is in direct contact with the semiconductor wires 125.

The metal gate electrode 270 of the gate stack structures 250 may include metal gate stacking layers over the gate dielectric layer 260. In some embodiments, the metal gate electrode 270 includes one or more work function layers and one or more metal filling layers. For example, in some embodiments, the metal gate electrode 270 includes a barrier layer 272, a work function layer 274, a glue layer 276, and a metal filling layer 278, as shown in FIG. 1N. Some of these metal gate stacking layers can be replaced or eliminated for different embodiments. Additional layers can be added into the metal gate electrode 270 of the gate stack structures 250.

As shown in FIG. 1N, the barrier layer 272 is between the gate dielectric layer 260 and the work function layer 274, in accordance with some embodiments. The barrier layer 272 may prevent diffusion between the gate dielectric layer 260 and the work function layer 274. In some embodiments, the barrier layer 272 includes titanium nitride, tantalum nitride, another suitable material, or a combination thereof.

The work function layer 274 is used to provide the desired work function for transistors to enhance device performance including improved threshold voltage. In the embodiments of forming an N-type transistor, the work function layer 274 can be an N-type metal layer, which is capable of providing a work function value suitable for the device. The work function value may be substantially equal to or less than about 4.5 eV. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a P-type transistor, the work function layer 274 can be a P-type metal layer, which is capable of providing a work function value suitable for the device. The work function value may be substantially equal to or greater than about 4.8 eV. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

Many variations and/or modifications can be made to embodiments of the disclosure. In some other embodiments, the work function layer 274 includes hafnium, zirconium, aluminum, metal carbide (e.g., hafnium carbide, zirconium carbide, titanium carbide, aluminum carbide), ruthenium, palladium, platinum, cobalt, nickel, or a combination thereof. The thickness and/or the compositions of the work function layer 274 may be fine-tuned to adjust the work function level.

As shown in FIG. 1N, the glue layer 276 is between the work function layer 274 and the metal filling layer 278, in accordance with some embodiments. The glue layer 276 may increase the adhesion between the work function layer 274 and the metal filling layer 278. As a result, the metal filling layer 278 can be prevented from peeling or delamination. In some embodiments, the glue layer 276 includes tantalum nitride, titanium nitride, another suitable material, or a combination thereof.

The metal filling layer 278 provides an electrical connection between the work function layer 274 and a subsequently formed conductive via that is coupled to the metal filling layer 278. In some embodiments, the metal filling layer 278 includes aluminum, tungsten, copper, gold, platinum, cobalt, another suitable metal material, an alloy thereof, or a combination thereof.

In some embodiments, these metal gate stacking layers (such as the barrier layer 272, the work function layer 274, the glue layer 276 and the metal filling layer 278) are deposited using an ALD process, a PVD process, a CVD process, an electroplating process, an electroless plating process, another applicable process, or a combination thereof. The deposited gate dielectric layer 260 and deposited the metal gate stacking layers together fill up the trenches 245. Afterwards, the portions of the gate dielectric layer 260 and the metal gate stacking layers outside of the trenches 245 (not shown) are removed. The metal gate stacking layers in one of the trenches 245 form the metal gate electrode 270. As a result, the gate dielectric layer 260 and the metal gate electrode 270 remaining in one of the trenches 245 together form the gate stack structures 250. A planarization process is performed to partially remove the gate dielectric layer 260 and the metal gate stacking layers outside of the trenches 245. The planarization process may include a CMP process, a grinding process, an etching process, another applicable process, or a combination thereof.

Figure 1O:
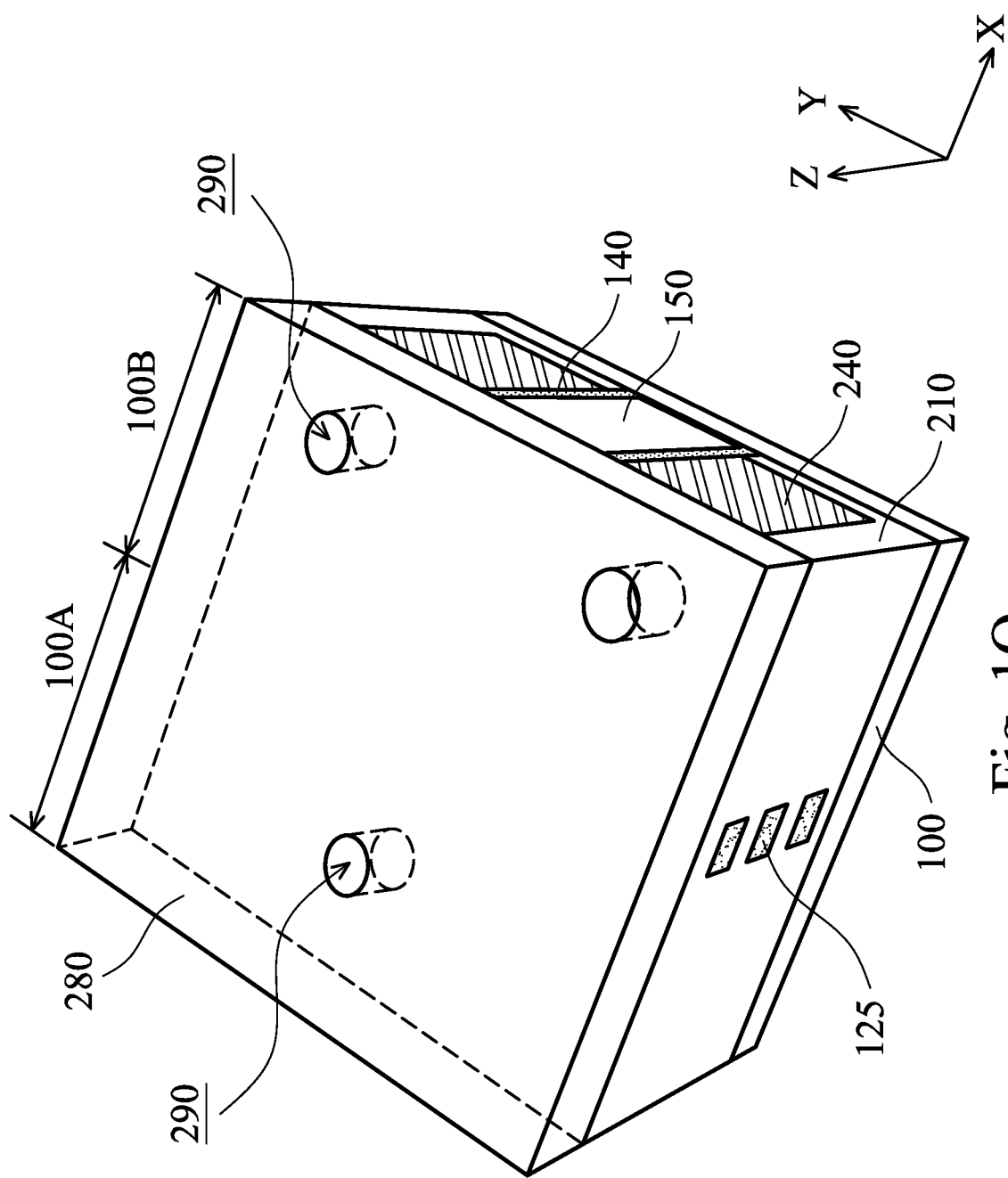

As shown in FIG. 1O, a dielectric layer 280 is deposited over the dielectric layer 210 in the regions 100A and the regions 100B, in accordance with some embodiments. The dielectric layer 280 covers the contact structures 240 and the gate stack structures 250. The dielectric layer 280 may serve as an inter-metal dielectric (IMD) layer of an interconnection structure.

In some embodiments, the dielectric layer 280 is made of silicon oxide, silicon oxynitride, borosilicate glass (BSG), phosphoric silicate glass (PSG), borophosphosilicate glass (BPSG), fluorinated silicate glass (FSG), a low-K material, a porous dielectric material, another suitable dielectric material, or a combination thereof. The material of the dielectric layer 280 is selected to minimize size, propagation delays, and crosstalk between nearby conductive features. In some embodiments, the dielectric layer 280 is deposited using a CVD process, a spin-on process, a spray coating process, an ALD process, a PVD process, another applicable process, or a combination thereof.

As shown in FIG. 1O, multiple openings 290 are formed in the dielectric layer 280, in accordance with some embodiments. The openings 290 in the regions 100A and the regions 100B expose the contact structures 240 and the gate stack structures 250, respectively. In some embodiments, photolithography and etching processes are performed to form the openings 290.

Figure 1P:
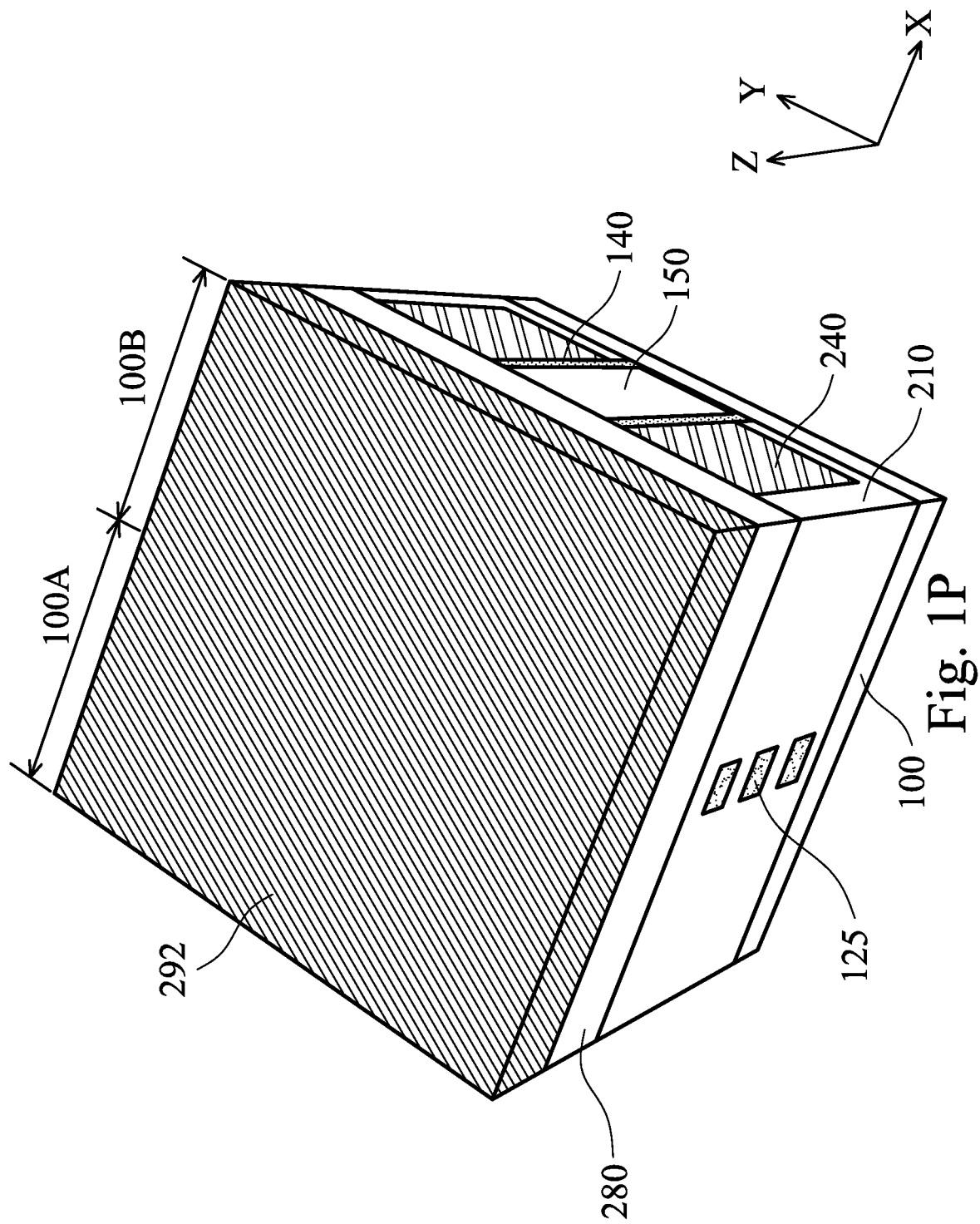

Afterwards, a conductive material 292 is deposited over the dielectric layer 280 to fill the openings 290, as shown in FIG. 1P. In some embodiments, the conductive material 292 includes copper, aluminum, tungsten, titanium, nickel, gold, platinum, another suitable material, or a combination thereof. In some embodiments, the conductive material 292 is deposited using a CVD process, a PVD process, an electroplating process, an electroless plating process, another applicable process, or a combination thereof.

Figure 1Q:
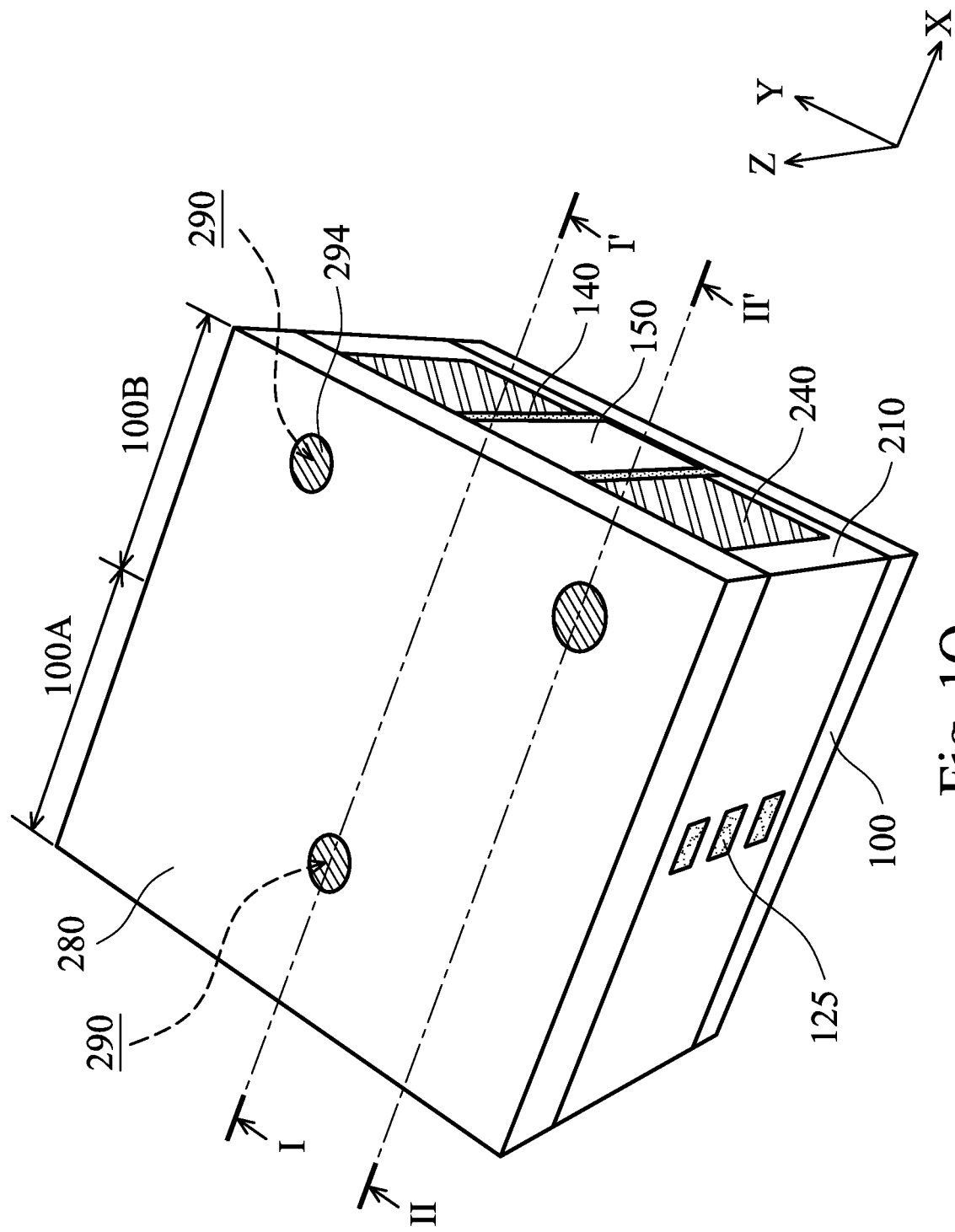

A planarization process is subsequently used to remove the portions of the conductive material 292 outside of the openings 290. As a result, the remaining portions of the conductive material 292 in the openings 290 form multiple conductive vias 294 in the dielectric layer 280, as shown in FIG. 1Q. The conductive vias 294 penetrate through the dielectric layer 280. Some of the conductive vias 294 are electrically connected to the contact structures 240. Some of the conductive vias 294 are electrically connected to the gate stack structures 250.

Subsequently, one or more dielectric layers and conductive features are formed on the dielectric layer 280 and the conductive vias 294 to continue the formation of the interconnection structure. The conductive features may include conductive lines, conductive vias, and/or other suitable conductive features. Various device elements (such as FETs) are interconnected through the interconnection structure to form integrated circuit devices.

Figure 2:
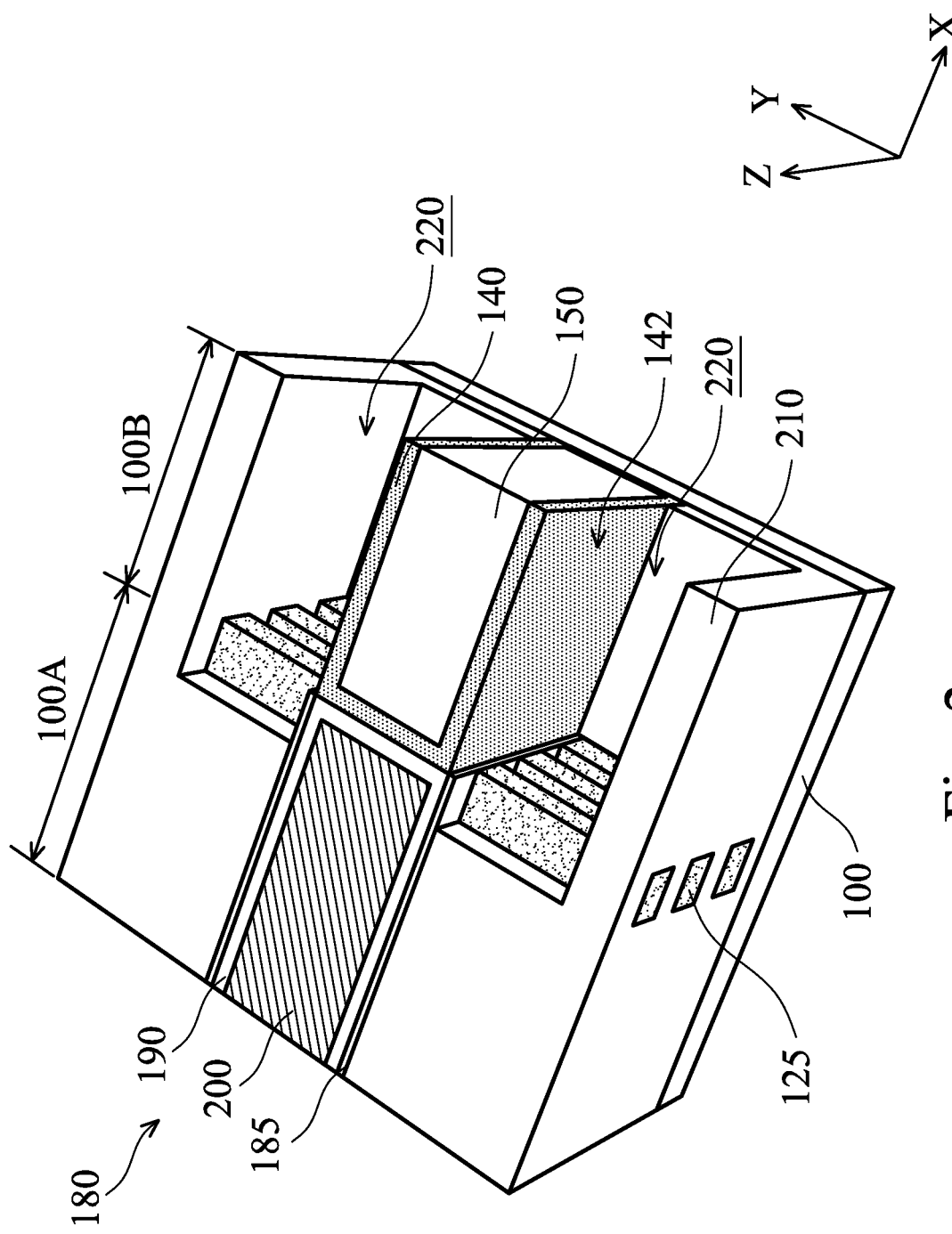
FIG. 2 is a perspective view of one of various stages of a process for forming a semiconductor device structure, in accordance with some embodiments.

Many variations and/or modifications can be made to embodiments of the disclosure. For example, trenches for forming contact electrodes are not limited to the trenches 220 shown in FIG. 1K. In some other embodiments, the dielectric layer 210 in the regions 100A and the regions 100B is partially removed. As a result, trenches 220' are formed in the dielectric layer 210 in the regions 100B and extend into the regions 100A, as shown in FIG. 2. In some embodiments, the trenches 220' expose multiple surfaces of the semiconductor wires 125. For example, the dielectric layer 210 between the semiconductor wires 125 and on the topmost of the semiconductor wires 125 is removed. As a result, the trenches 220' expose side, top and bottom surfaces of the semiconductor wires 125, as shown in FIG. 2.

Figure 3A:
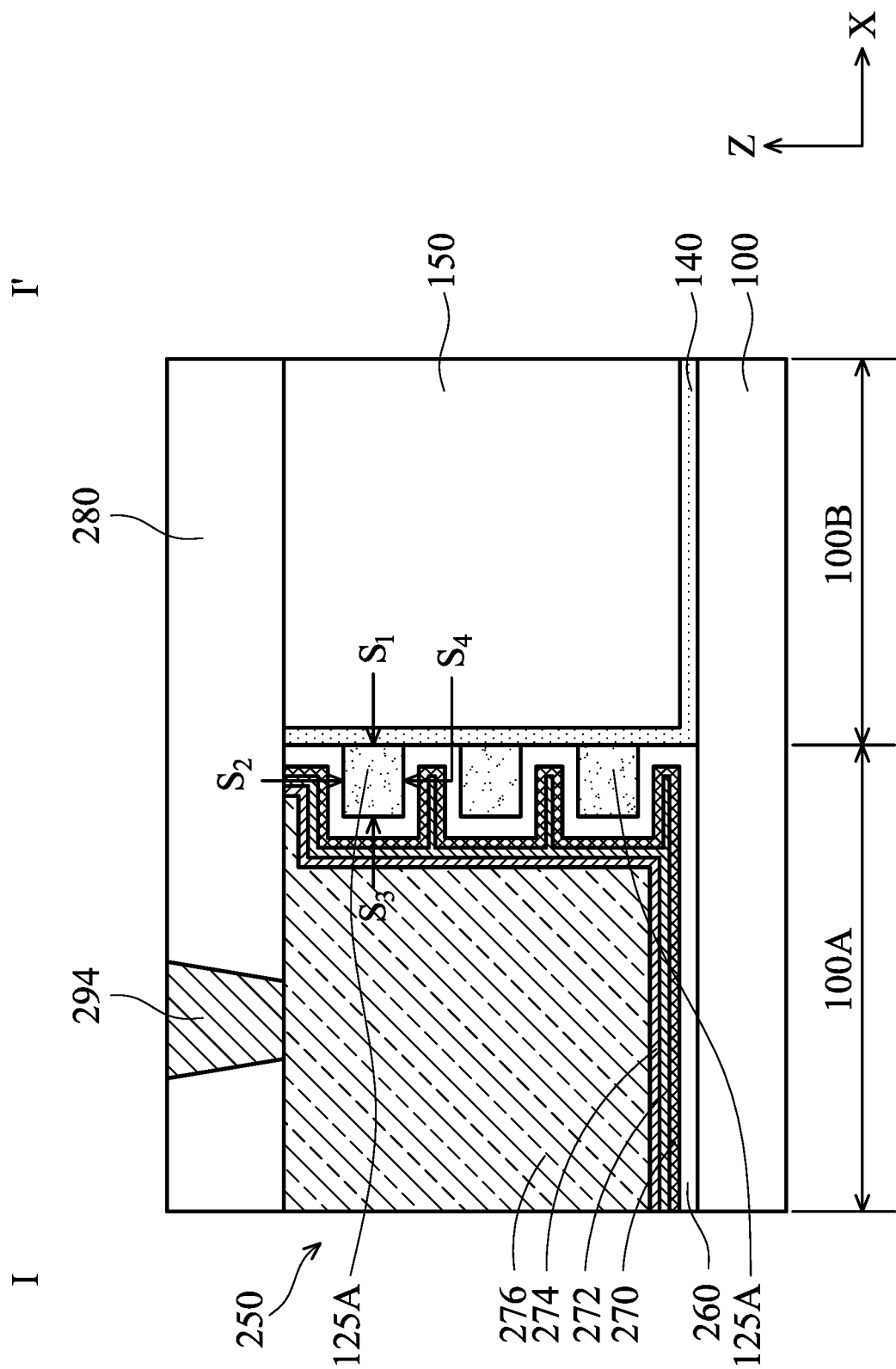
FIGS. 3A and 3B are cross-sectional views of a semiconductor device structure, in accordance with some embodiments.
Figure 3B:
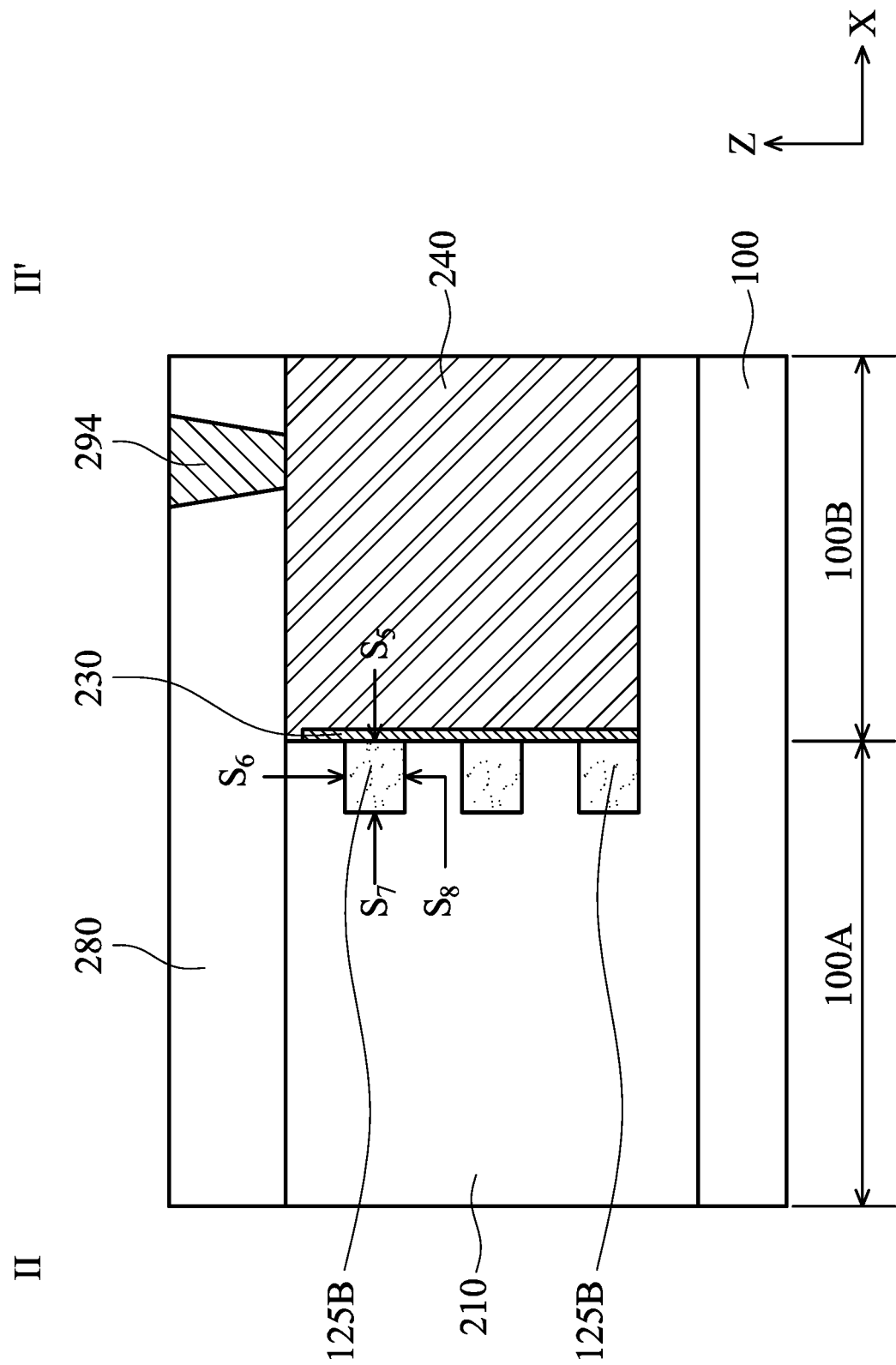

FIGS. 3A and 3B are cross-sectional views of a semiconductor device structure, in accordance with some embodiments. In some embodiments, FIG. 3A is a cross-sectional view of the semiconductor device structure taken along the line I-I' shown in FIG. 1Q. In some embodiments, FIG. 3B is a cross-sectional view of the semiconductor device structure taken along the line II-IF shown in FIG. 1Q. Each of the semiconductor wires 125 in the regions 100A includes a channel region 125A and source/drain regions 125B, as shown in FIGS. 3A and 3B in accordance with some embodiments.

In some embodiments, the channel region 125A is partially enveloped in the gate stack structures 250 in the regions 100A, as shown in FIG. 3A. In some embodiments, the adhesive layer 140 in the regions 100B is sandwiched between the channel region 125A in the regions 100A and the dielectric layer 150 in the regions 100B in the X-Z plane, as shown in FIG. 3A.

In some embodiments, the gate stack structures 250 partially surround the channel region 125A. In some embodiments, multiple surfaces of the channel region 125A are covered by the gate stack structures 250 while one surface of the channel region 125A is covered by the adhesive layer 140 and the dielectric layer 150. For example, as shown in FIG. 3A, the adhesive layer 140 covers one surface $S_1$ of the channel region 125A while one of the gate stack structures 250 covers three surfaces $S_2$, $S_3$ and $S_4$ of the channel region 125A. As a result, the interface between the gate stack structures 250 and the channel region 125A is interrupted by the adhesive layer 140 in the X-Z plane. In some embodiments, one of the gate stack structures 250, the adhesive layer 140 and the dielectric layer 150 together wind around the channel region 125A in the X-Z plane, as shown in FIG. 3A.

In some embodiments, the source/drain regions 125B are clad in the dielectric layer 210 in the regions 100A, as shown in FIG. 3B. In some embodiments, one of the silicide structures 230 is sandwiched between one of the source/drain regions 125B in the regions 100A and one of the contact structures 240 in the regions 100B in the X-Z plane, as shown in FIG. 3B.

In some embodiments, the contact electrodes including the silicide structures 230 and the contact structures 240 adjoin the source/drain regions 125B but do not surround the source/drain regions 125B, as shown in FIG. 3B. In some embodiments, one surface of the source/drain regions 125B is covered by the silicide structures 230 and the contact structures 240 while multiple surfaces of the source/drain regions 125B are covered by the dielectric layer 210. For example, as shown in FIG. 3B, the dielectric layer 210 covers three surfaces $S_6$, $S_7$ and $S_8$ of the source/drain regions 125B, and one surface $S_5$ of the source/drain regions 125B is not covered by the dielectric layer 210. In some embodiments, the dielectric layer 210, the silicide structures 230 and the contact structures 240 together encircle the source/drain regions 125B in the X-Z plane, as shown in FIG. 3B.

In some embodiments, the contact electrodes including the silicide structures 230 and the contact structures 240 adjoin the source/drain regions 125B but do not surround the source/drain regions 125B, as shown in FIG. 3B. In some embodiments, one surface of the source/drain regions 125B is covered by the silicide structures 230 and the contact structures 240 while multiple surfaces of the source/drain regions 125B are covered by the dielectric layer 210. For example, as shown in FIG. 3B, the dielectric layer 210 covers three surfaces $S_6$, $S_7$ and $S_8$ of the source/drain regions 125B, and one surface $S_5$ of the source/drain regions 125B is not covered by the dielectric layer 210. In some embodiments, the dielectric layer 210, the silicide structures 230 and the contact structures 240 together encircle the source/drain regions 125B in the X-Z plane, as shown in FIG. 3B.

Figure 4:
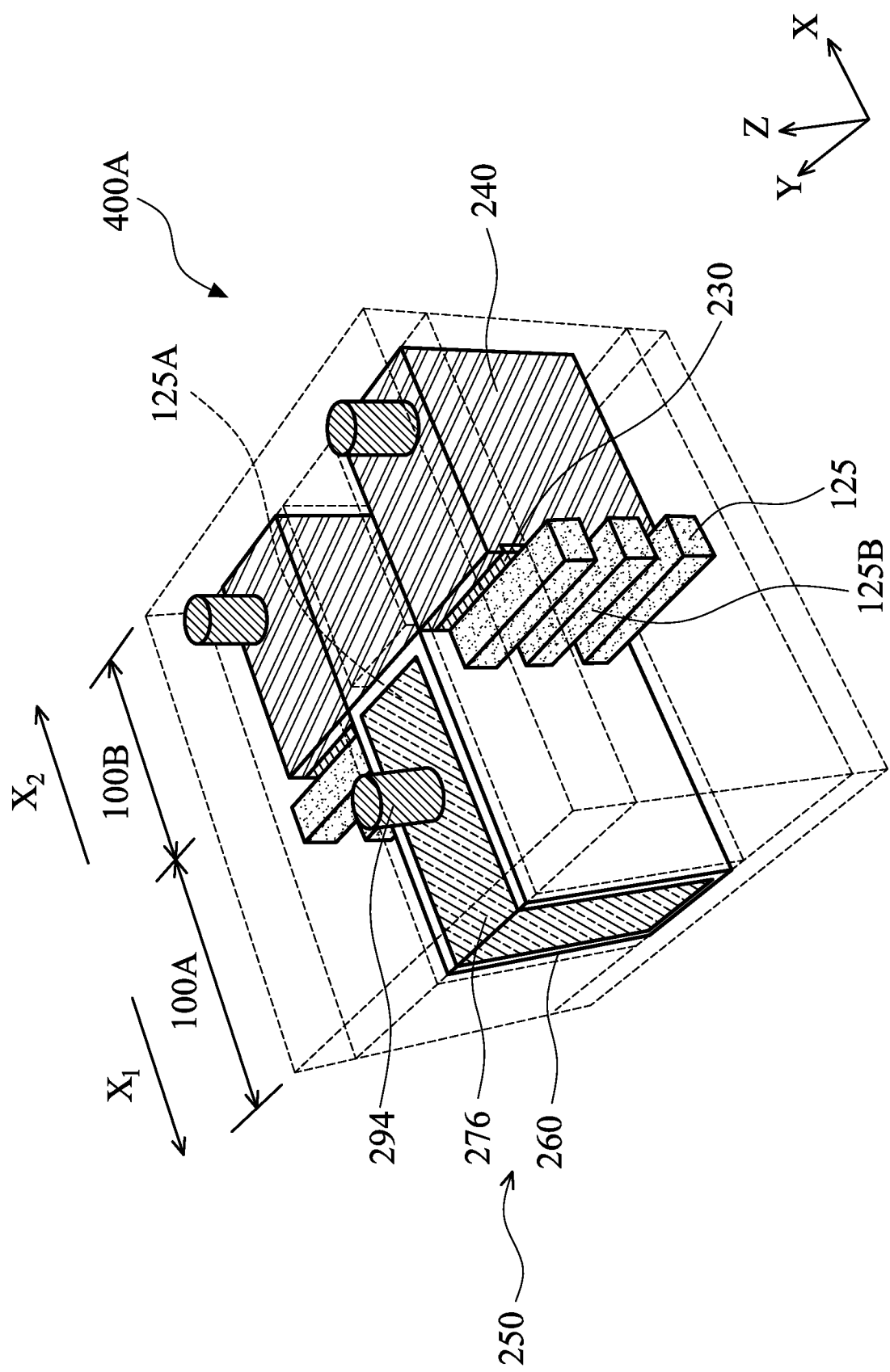
FIG. 4 is a perspective view of a semiconductor device structure, in accordance with some embodiments.

FIG. 4 is a perspective view of a semiconductor device structure, in accordance with some embodiments. The structure 400A shown in FIG. 4 is the same as those shown in FIGS. 1Q, 3A and 3B. For a better understanding of the structure, some features of the structure 400A are illustrated as dashed lines, and the barrier layer 272, the work function layer 274, the glue layer 276 and the metal filling layer 278 are not shown in FIG. 4. The structure 400A may be referred to as a transistor structure.

As shown in FIG. 4, the gate stack structures 250 and the contact structures 240 extend from the semiconductor wires 125 in opposite directions along the X-axis, in accordance with some embodiments. In some embodiments, the gate stack structures 250 extend in the regions 100A in a direction $X_1$ without crossing the boundary between the regions 100A and the regions 100B. In some embodiments, the contact structures 240 extend in the regions 100B in a direction $X_2$, which is opposite to the direction $X_1$, without crossing the boundary between the regions 100A and the regions 100B. As a result, the gate stack structures 250 and the contact structures 240, which are substantially parallel to the X-axis, do not laterally overlap each other. In some embodiments, the gate stack structures 250 are staggered with respect to the contact structures 240.

In some embodiments, the semiconductor wires 125 are partially surrounded by the gate stack structures 250. For example, the gate stack structures 250 encompass three surfaces of the semiconductor wires 125. In some embodiments, one surface of the source/drain regions 125B of the semiconductor wires 125 is covered by the contact structures 240. In some embodiments, the covered surface of the semiconductor wires 125 by the contact structures 240 is non-coplanar with the covered surface of the semiconductor wires 125 by the gate stack structures 250. In some embodiments, the covered surface of the semiconductor wires 125 by the contact structures 240 is opposite to the covered surface of the semiconductor wires 125 by the gate stack structures 250.

Figure 5:
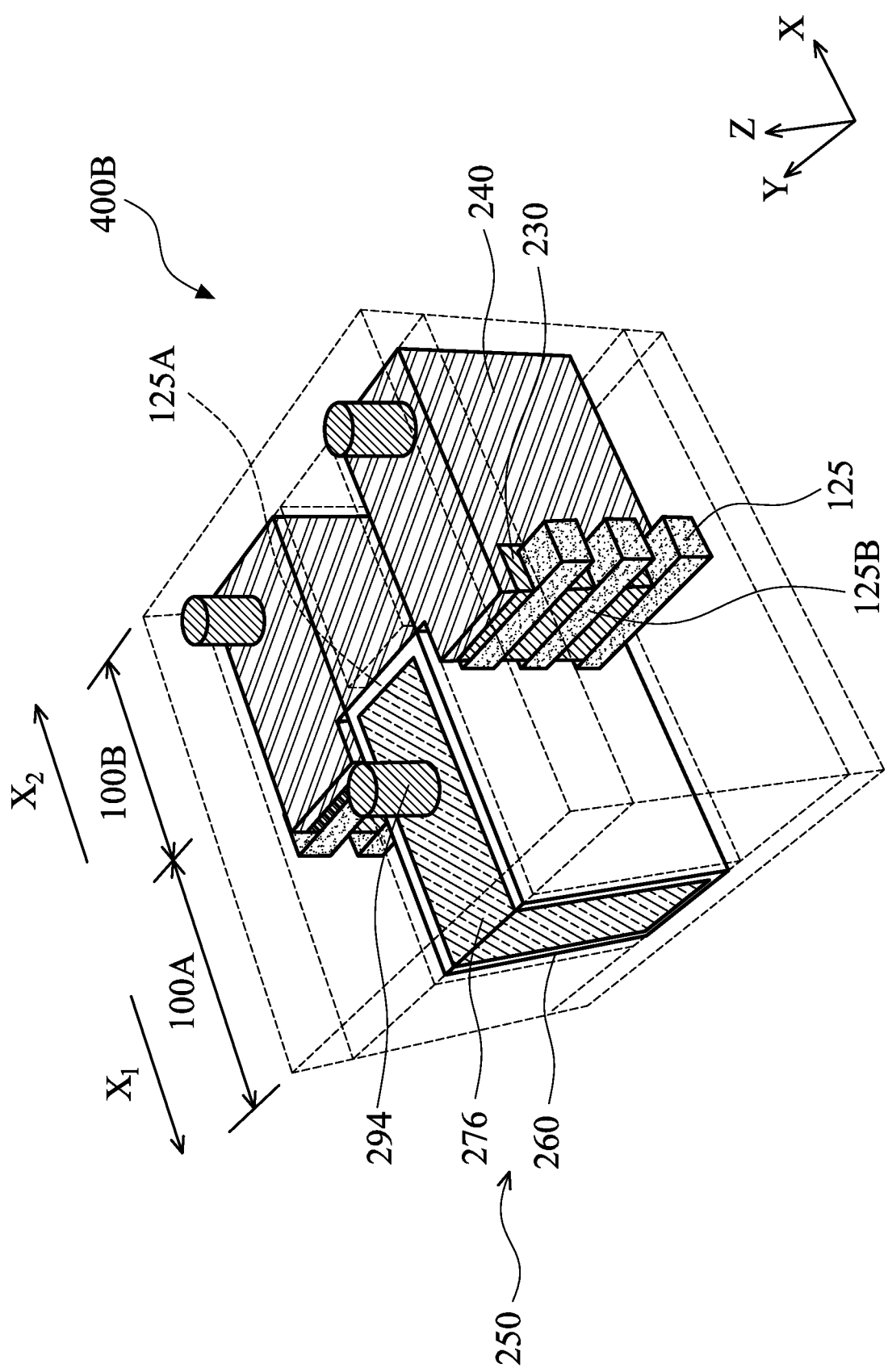
FIG. 5 is a perspective view of a semiconductor device structure, in accordance with some embodiments.
Figure 6:
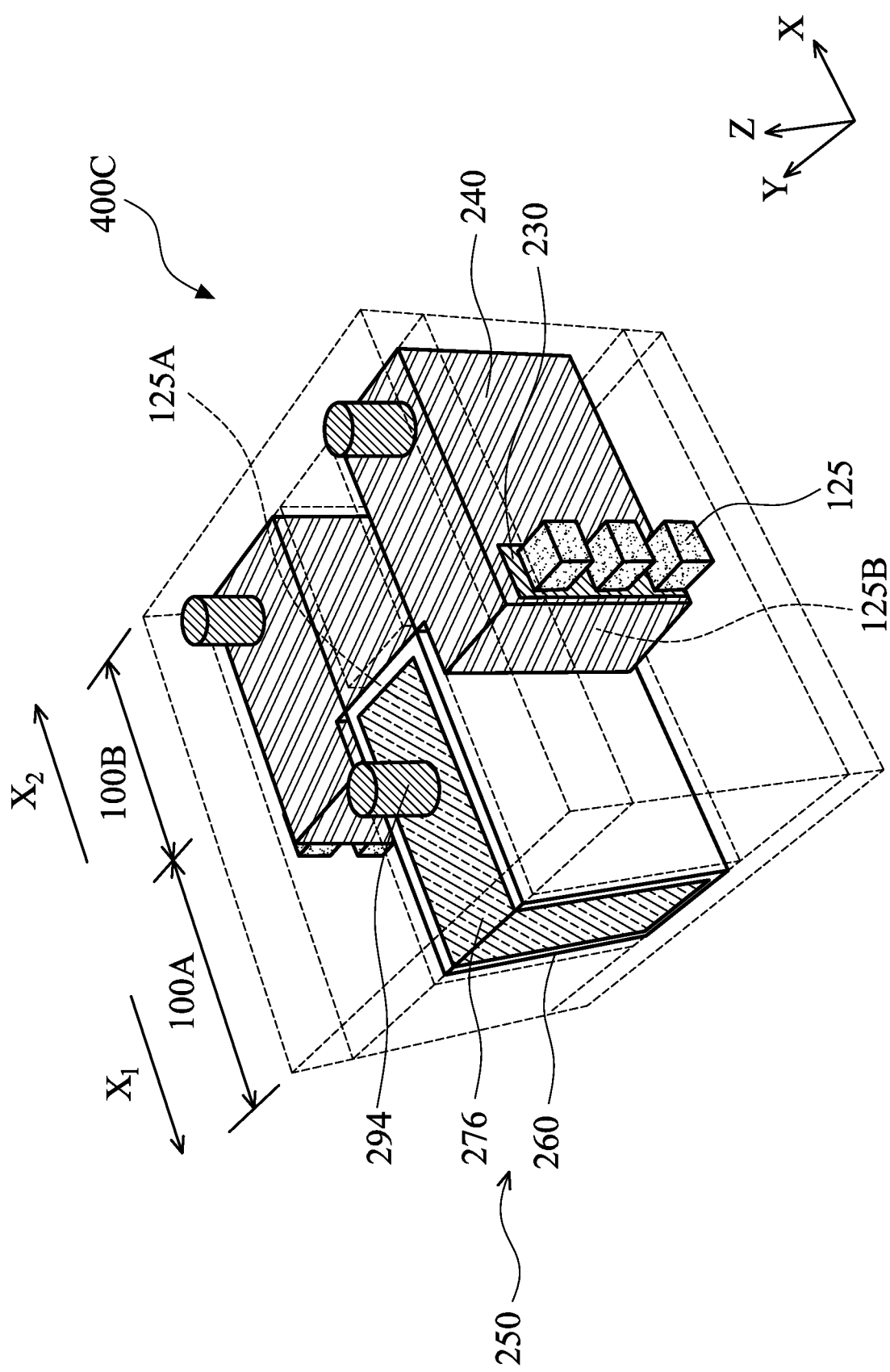
FIG. 6 is a perspective view of a semiconductor device structure, in accordance with some embodiments.

Many variations and/or modifications can be made to embodiments of the disclosure. FIG. 5 is a perspective view of a semiconductor device structure, in accordance with some embodiments. FIG. 6 is a perspective view of a semiconductor device structure, in accordance with some embodiments. Some features of the structure 400B shown in FIG. 5 and the structure 400C shown in FIG. 6 are illustrated as dashed lines for a better understanding of the structure. In some embodiments, the materials and/or formation methods of the semiconductor device structure shown in FIGS. 1A-1Q, 3A and 3B can also be applied in the embodiments illustrated in FIGS. 5 and 6, and are therefore not repeated. The structures 400B and 400C are similar to the structure 400A shown in FIG. 4.

As shown in FIG. 5, the contact structures 240 extend in the regions 100B across the boundary between the regions 100A and the regions 100B, in accordance with some embodiments. For example, the contact structures 240 partially surround the semiconductor wires 125. In some embodiments, three surfaces of the semiconductor wires 125 are encircled by the contact structures 240. As a result, the gate stack structures 250 and the contact structures 240, which extend along the X-axis and are substantially parallel to each other, slightly laterally overlap each other. In some embodiments, the surface of the semiconductor wires 125, which is not covered by the contact structures 240, is non-coplanar with and opposite to the surface of the semiconductor wires 125, which is not covered by the gate stack structures 250.

In some embodiments, the silicide structures 230 extend across the boundary between the regions 100A and the regions 100B, and partially surround the semiconductor wires 125. In some embodiments, the interface between the silicide structures 230 and the source/drain regions 125B of the semiconductor wires 125 is discontinuous or disconnected.

As shown in FIG. 6, the contact structures 240 extend across the boundary between the regions 100A and the regions 100B, and continuously surround the semiconductor wires 125, in accordance with some embodiments. In some embodiments, the contact structures 240 do not extend along the gate stack structures 250. As a result, the gate stack structures 250 and the contact structures 240, which extend along the X-axis and are substantially parallel to each other, slightly laterally overlap each other.

In some embodiments, the silicide structures 230 extend across the boundary between the regions 100A and the regions 100B, and continuously surround the semiconductor wires 125. In some embodiments, the interface between the silicide structures 230 and the source/drain regions 125B of the semiconductor wires 125 is continuous.

In the embodiments illustrated in FIGS. 5 and 6, a portion of the contact structures 240, which extends from the regions 100B into the regions 100A, laterally overlaps the gate stack structures 250 in the regions 100A. As a result, the parasitic capacitance between the gate stack structures 250 and the contact structures 240 is greatly reduced.

On the other hand, in the embodiments illustrated in FIG. 4, the gate stack structures 250 and the contact structures 240 do not laterally overlap each other. As a result, the parasitic capacitance between the gate stack structures 250 and the contact structures 240 in the regions 100A and the regions 100B is significantly eliminated. Accordingly, the gate-to-contact parasitic capacitance in the semiconductor device structure is suppressed. Therefore, the required power of the semiconductor device structure is lowered and the operation speed of the semiconductor device structure is improved even further.

Figure 7:
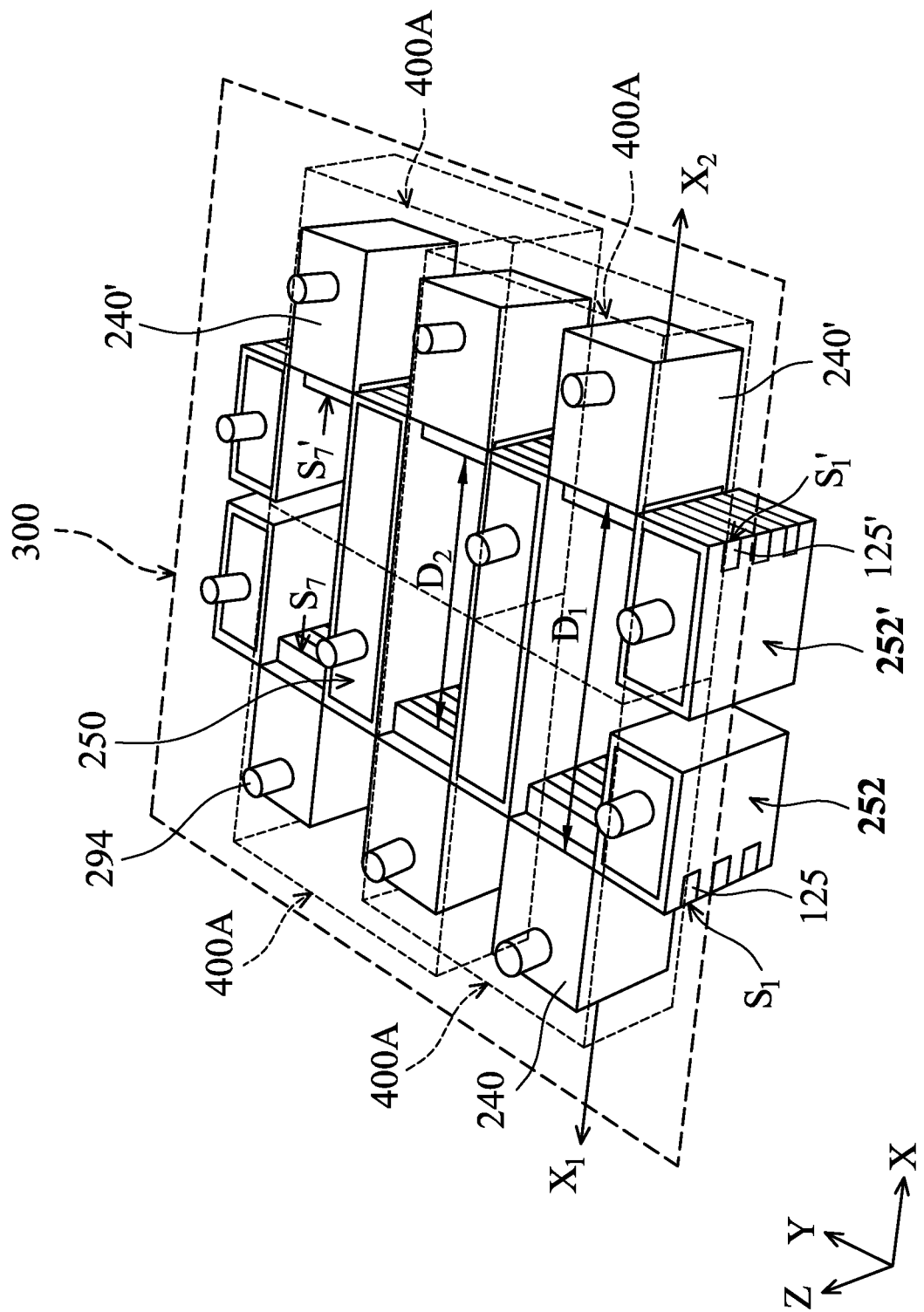
FIG. 7 is a perspective view of a semiconductor device structure, in accordance with some embodiments.

In accordance with some embodiments, the semiconductor device structure includes an array of multiple cells containing one or more transistor structures. Each transistor structure includes a channel region, source/drain regions, a gate stack structure and contact electrodes. FIG. 7 is a perspective view of a semiconductor device structure, in accordance with some embodiments. For the purpose of simplicity and clarity, one of the cells (i.e. a cell 300) is shown in FIG. 7 as an example. The boundary of the cell 300 is illustrated as dashed lines for a better understanding of the structure.

In the cell 300 shown in FIG. 7, multiple semiconductor wires 125 and 125' are arranged in a line (or tier) along the X-axis, in accordance with some embodiments. Multiple gate stack structures 250 are between the semiconductor wires 125 and 125'. In some embodiments, the gate stack structures 250 are arranged in a line along the Y-axis. In some embodiments, multiple gate stack structures 252 and 252' are between the semiconductor wires 125 and 125', and on opposite sides of the line of gate stack structures 250.

Each of the gate stack structures 250 partially surrounds the semiconductor wires 125 and 125'. Each of the gate stack structures 252 and 252' partially surrounds one of the semiconductor wires 125 and 125'. Each of the semiconductor wires 125 has one surface $S_1$ not covered by the gate stack structures 250, 252 or 252'. Each of the semiconductor wires 125' has one surface $S_1'$ not covered by the gate stack structures 250, 252 or 252'. In some embodiments, the surfaces $S_1$ of the semiconductor wires 125 and the surfaces $S_1'$ of the semiconductor wires 125' are opposite and face away from each other, as shown in FIG. 7.

In some embodiments, multiple contact structures 240 and 240' are arranged in lines along the Y-axis. Each of the contact structures 240 covers the semiconductor wire 125 but does not surround the semiconductor wire 125. Each of the contact structures 240' covers the semiconductor wires 125' but does not surround the semiconductor wire 125'. However, embodiments of the disclosure are not limited. The contact structures 240 and 240' may wrap around the semiconductor wires 125 and 125', respectively.

In some embodiments, the contact structures 240 and 240' are staggered with respect to the gate stack structures 250, 252 and 252'. In some embodiments, the gate stack structures 250, 252 and 252' extend along the X-axis and are substantially parallel to the contact structures 240 and 240' without overlapping the contact structures 240 and 240'. In some embodiments, the contact structures 240 extend in the direction $X_1$ along the X-axis away from the gate stack structures 250, 252 and 252' and the semiconductor wires 125, as shown in FIG. 7. The contact structures 240' extend in the direction $X_2$, which is opposite to the direction $X_1$, away from the gate stack structures 250, 252 and 252' and the semiconductor wires 125'. As a result, one surface $S_7$ of the semiconductor wire 125, which is not covered by the contact structures 240, face one surface $S_7'$ of the semiconductor wire 125', which is not covered by the contact structures 240'.

In some embodiments, the contact structures 240 and 240' are spaced apart from each other by a distance $D_1$. The semiconductor wires 125 and 125' are spaced apart from each other by a distance $D_2$. In some embodiments, the distance $D_1$ is greater than the distance $D_2$, as shown in FIG. 7. In some embodiments, the distance $D_1$ is substantially equal to the length of one of the gate stack structures 250 extending between the semiconductor wires 125 and 125'. Embodiments of the disclosure are not limited. In some other embodiments, the distance $D_1$ is less than or substantially equal to the distance $D_2$.

In some embodiments, there is no contact structure extending between two of the gate stack structures 250. Therefore, the size of the gate stack structures 250 can be increased to meet requirements. For example, the gate stack structures 250 have a width measured along the Y-axis. The width of the gate stack structures 250 is increased so that the gate stack structures 250 cover more areas of the semiconductor wires 125. As a result, a wider channel region (such as the channel region 125A shown in FIG. 3A) is provided.

In some embodiments, there is no gate stack structure 250 extending between two of the contact structures 240 or 240'. Therefore, the size of the contact structures 240 or 240' can be increased to meet requirements. For example, the contact structures 240 or 240' have a width measured along the Y-axis. The width of the contact structures 240 or 240' is increased. As a result, trenches (such as the trenches 220 shown in FIG. 1K), which create space in the dielectric layer 210 for subsequently formed the contact structures 240 or 240', have a lowered aspect ratio. Accordingly, it is easier to form the contact structures 240 or 240'.

Alternatively, the number of the gate stack structures 250, the number of the contact structures 240 and 240', and the number of the semiconductor wires 125 and 125' can be increased to meet requirements. For example, the numbers of the gate stack structures 250, the contact structures 240 and 240', and the semiconductor wires 125 and 125' is increased so as to form more transistors in the semiconductor device structure.

In some embodiments, multiple N-type FETs or P-type FETs are configured to be formed in the cell 300. For example, as shown in FIG. 7, the cell 300 includes multiple structures 400A shown in FIG. 4. However, embodiments of the disclosure are not limited thereto. In some other embodiments, the cell 300 includes multiple structures 400B shown in FIG. 5, multiple structures 400C shown in FIG. 6, or other suitable transistor structures. The materials and/or formation methods of the semiconductor device structure shown in FIGS. 1A-1Q can also be applied in the embodiments illustrated in FIG. 7, and are therefore not repeated. Some features of the semiconductor device structure are not shown in FIG. 7 for a better understanding of the structure.

FIG. 7 shows multiple structures 400A. Generally, each of the structures 400A includes one semiconductor wire 125 or 125', one gate stack structure 250 and two contact structures 240 or 240'. However, in some embodiments, two structures 400A on the left side in FIG. 7 share the same source/drain regions of the semiconductor wire 125 and the same contact structure 240. Accordingly, there are three contact structures 240 (not four contact structures 240) on the left side in FIG. 7. These two structures 400A on the left side in FIG. 7 partially overlap with each other.

Similarly, in some embodiments, two structures 400A on the right side in FIG. 7 share the same source/drain regions of the semiconductor wire 125' and the same contact structure 240'. Accordingly, there are three contact structures 240' (not four contact structures 240') on the right side in FIG. 7. These two structures 400A on the right side in FIG. 7 partially overlap with each other.

As shown in FIG. 7, four structures 400A and four gate stack structures 252 and 252' form the cell 300, in accordance with some embodiments. The gate stack structures 252 and 252' in the cell 300 (illustrated by bold reference numerals) are physically and electrically connected to the semiconductor wires 125 and 125', respectively. The gate stack structures 252 and 252' are separated from each other. The separated gate stack structures 252 and 252' may be used to define the boundary of the cell 300 (illustrated as dashed lines).

Although FIG. 7 shows that the cell 300 contains four transistor structures 400A, embodiments of the disclosure are not limited thereto. In some other embodiments, the semiconductor device structure includes a cell containing less or more than four transistor structures.

Figure 8:
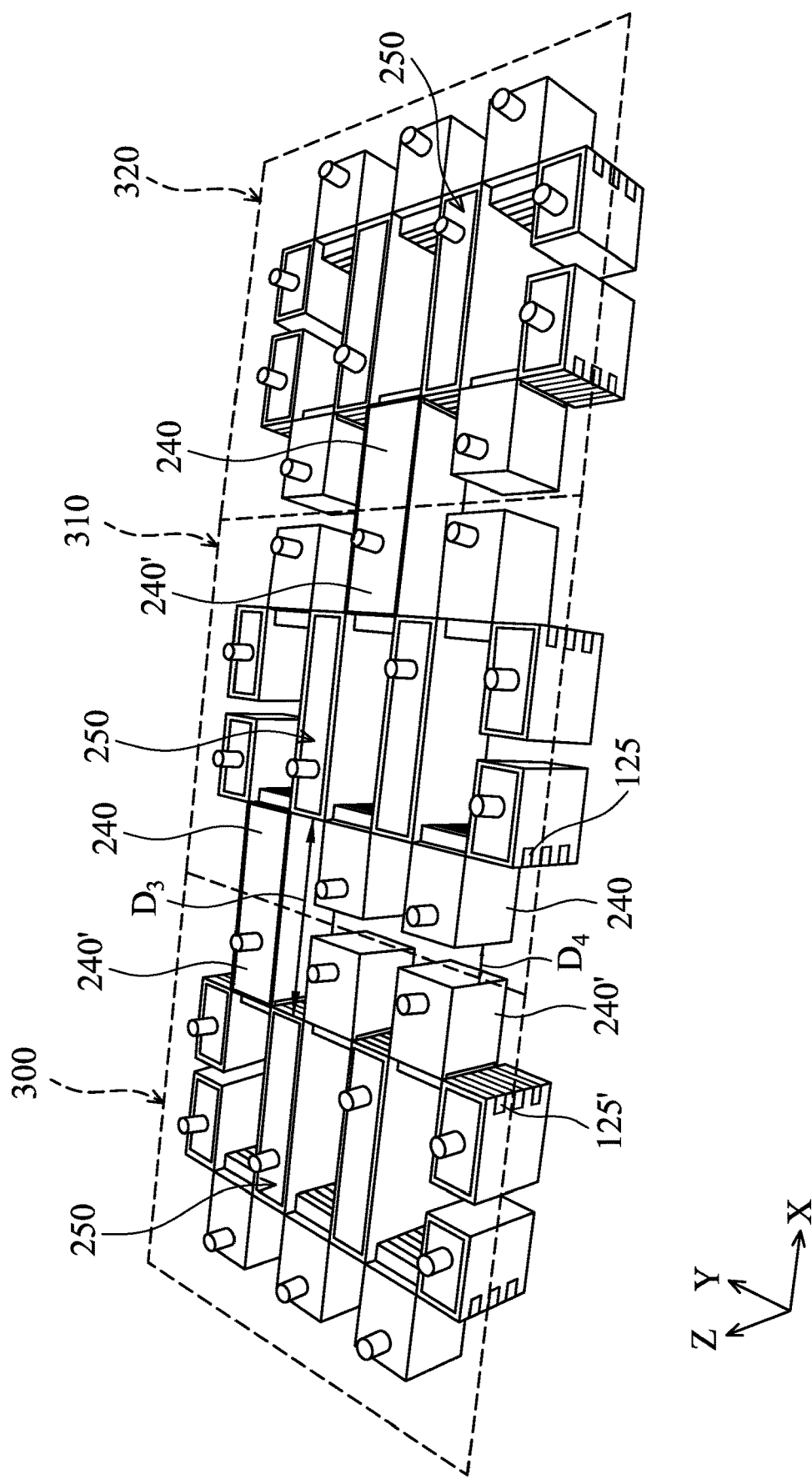
FIG. 8 is a top view of a semiconductor device structure, in accordance with some embodiments.

FIG. 8 is a perspective view of a semiconductor device structure, in accordance with some embodiments. A 1×3 array of cells 300, 310 and 320 are shown in FIG. 8 as an example. The boundaries of the cells 300, 310 and 320 are illustrated as dashed lines for a better understanding of the structure. In some embodiments, multiple complementary FETs including both N-type and P-type FETs are configured to be formed in the cells 300, 310 and 320. In some other embodiments, only N-type FETs or P-type FETs are configured to be formed in the cells 300, 310 and 320.

The configuration of the cells 310 and 320 is similar to or substantially the same as the described configuration of the cell 300, and are therefore not repeated. As shown in FIG. 8, the cells 300, 310 and 320 are arranged along the X-axis, in accordance with some embodiments. The cell 310 is between the cells 300 and 320. In some embodiments, one of the contact structures 240' in the cell 300 and one of the contact structures 240 in the cell 310 are connected to each other (illustrated as bold lines in FIG. 8). One of the contact structures 240' in the cell 310 and one of the contact structures 240 in the cell 320 are connected to each other (illustrated as bold lines in FIG. 8). However, embodiments of the disclosure are not limited thereto. In some other embodiments, the contact structures 240' in the cell 310 are separated from the contact structures 240 in the cell 320.

As shown in FIG. 8, the gate stack structures 250 in the cell 310 do not extend into the cells 300 and 320, in accordance with some embodiments. As a result, the gate stack structures 250 in the cell 310 are spaced apart from the gate stack structures 250 in the cells 300 and 320. In some embodiments, the gate stack structures 250 in the cell 300 are spaced apart from the gate stack structures 250 in the cell 310 by a distance $D_3$, as shown in FIG. 8. In some embodiments, there are multiple contact structures 240 and 240' arranged between the semiconductor wire 125' in the cell 300 and the semiconductor wire 125 in the cell 310. The contact structures 240' in the cell 300 are spaced apart from the contact structures 240 in the cell 310 by a distance $D_4$, as shown in FIG. 8. In some embodiments, the distance $D_3$ is greater than the distance $D_4$. In some embodiments, the distance $D_3$ is substantially equal to the distance between the semiconductor wire 125' in the cell 300 and the semiconductor wire 125 in the cell 310.

Although FIG. 8 shows a 1×3 array of cells, embodiments of the disclosure are not limited thereto. In some other embodiments, the semiconductor device structure includes any suitable array of cells. For example, in some other embodiments, the cell 320 is not formed. As a result, the semiconductor device structure includes a 1×2 array of cells 300 and 310. In some other embodiments, a fourth cell (not shown) may be added beside the cell 320 to from a 1×4 array of cells. The fourth cell may be substantially the same as the cell 300, 310 or 320. The contact structures in the fourth cell may or may not be connected to the contact structures 240' in the cell 320.

Figure 9:
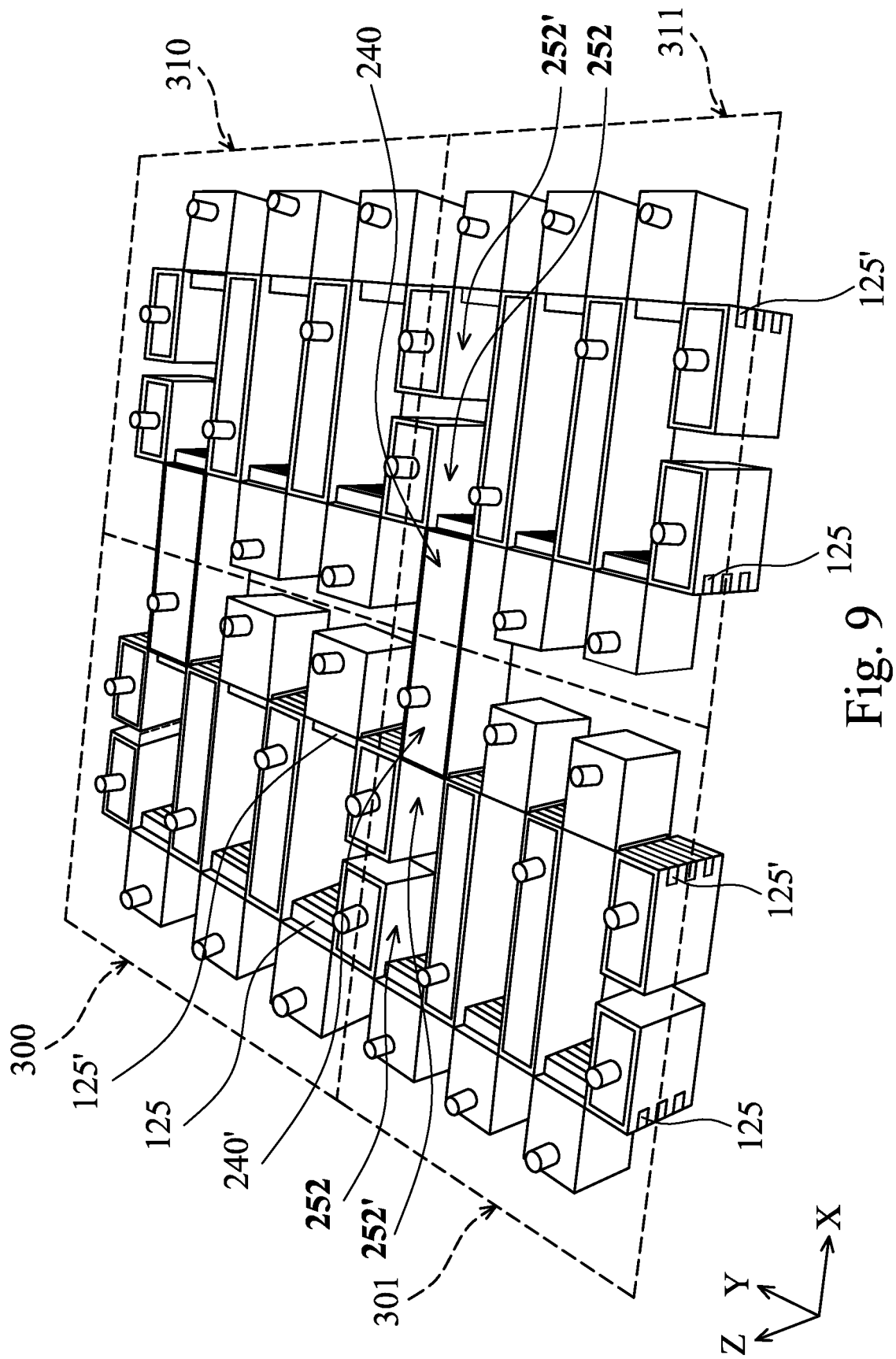
FIG. 9 is a perspective view of a semiconductor device structure, in accordance with some embodiments.

Many variations and/or modifications can be made to embodiments of the present disclosure. For example, although FIG. 8 shows one row of cells 300, 310 and 320, some other embodiments of the disclosure include multiple rows of cells. FIG. 9 is a perspective view of a semiconductor device structure, in accordance with some embodiments. A 2×2 array of cells 300, 301, 310 and 311 are shown in FIG. 9 as an example. In some embodiments, the configuration of the cells 301 and 311 is similar to or substantially the same as the configuration of the cell 300 and 310, respectively. Therefore, the configuration of the cells 301 and 311 is described in the embodiments of FIGS. 7 and 8, and is therefore not repeated.

As shown in FIG. 9, the cells 300 and 310 are arranged in a row along the X-axis, and the cells 301 and 311 are arranged in another row along the X-axis, in accordance with some embodiments. In some embodiments, a common semiconductor wire 125 is in the cells 300 and 301. More specifically, the semiconductor wire 125 in the cells 300 and 301 is connected to the gate stack structure 252 (illustrated by bold reference numerals on the left side in FIG. 9) and covered by the gate stack structure 252. The cells 300 and 301 share the same semiconductor wire 125.

Similarly, the same semiconductor wire 125' is shared between the cells 300 and 301. The semiconductor wire 125' in the cells 300 and 301 is connected to the gate stack structure 252' (illustrated by bold reference numerals on the left side in FIG. 9) and covered by the gate stack structure 252'. In some embodiments, the connection between the cells 310 and 311 is similar to or substantially the same as the connection between the cell 300 and 301. Therefore, the connection between the cells 310 and 311 is described above, and is therefore not repeated.

In some embodiments, two gate stack structures 252 and 252' (illustrated by bold reference numerals on the left side in FIG. 9) are separated from each other. The separated gate stack structures 252 and 252' extend along the boundary between the cells 310 and 311. The boundary is illustrated as a dashed line in FIG. 9. The separated gate stack structures 252 and 252' may define the boundary between the cells 300 and 301. Similarly, two gate stack structures 252 and 252' (illustrated by bold reference numerals on the right side in FIG. 9) are separated from each other. The separated gate stack structures 252 and 252' extend along the boundary between the cells 310 and 311. The separated gate stack structures 252 and 252' may define the boundary between the cells 310 and 311.

Many variations and/or modifications can be made to embodiments of the present disclosure. For example, although FIGS. 1A-1Q, 2, 3A, 3B and 4-9 show a semiconductor device structure having a nanowire and a metal gate stack, embodiments of the disclosure are not limited thereto. Some other embodiments of the disclosure include a semiconductor device structure having a nanowire and a poly silicon gate stack, or another suitable semiconductor device structure.

Embodiments of the disclosure form a semiconductor device structure with a nanowire. The semiconductor device structure includes a gate stack structure and a contact electrode that are electrically connected to the nanowire. The gate stack structure partially surrounds the nanowire. The contact electrode and the gate stack structure extend from the nanowire in opposite directions so that the overlapping area of the gate stack structure and the contact electrode is reduced or substantially eliminated. As a result, the parasitic capacitance between the gate stack structure and the contact electrode is mitigated. Accordingly, the gate-to-contact parasitic capacitance in the semiconductor device structure is greatly reduced. Therefore, the required power of the semiconductor device structure is lowered and the performance of the semiconductor device structure is enhanced. Embodiments of the disclosure can be applied to low-power devices of a small size.

In accordance with some embodiments, a semiconductor device structure is provided. The semiconductor device structure includes a first dielectric layer. The semiconductor device structure also includes a gate stack structure in the first dielectric layer. The semiconductor device structure further includes a semiconductor wire partially surrounded by the gate stack structure. In addition, the semiconductor device structure includes a contact electrode in the first dielectric layer and electrically connected to the semiconductor wire. The contact electrode and the gate stack structure extend from the semiconductor wire in opposite directions.

In accordance with some embodiments, a semiconductor device structure is provided. The semiconductor device structure includes a first semiconductor wire. The semiconductor device structure also includes a second semiconductor wire. The semiconductor device structure further includes a gate stack structure extending between the first semiconductor wire and the second semiconductor wire. The first semiconductor wire and the second semiconductor wire are partially surrounded by the gate stack structure. In addition, the semiconductor device structure includes a first contact electrode electrically connected to the first semiconductor wire. The semiconductor device structure also includes a second contact electrode electrically connected to the second semiconductor wire. The first contact electrode and the second contact electrode extend away from each other in opposite directions.

In accordance with some embodiments, a method for forming a semiconductor device structure is provided. The method includes forming a stacked layer comprising alternately deposited first dielectric layers and semiconductor layers. The method also includes partially removing the stacked layer to form a first trench. The method further includes filling the first trench with a second dielectric layer. In addition, the method includes removing the first dielectric layers and patterning the semiconductor layers to form semiconductor wires. The semiconductor wires are attached to the second dielectric layer. The method also includes forming a third dielectric layer comprising a second trench and forming a gate stack structure in the second trench. The semiconductor wires are partially surrounded by the gate stack structure. The method further includes forming a contact electrode electrically connected to the semiconductor wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first dielectric layer;
a gate stack structure in the first dielectric layer;
a first semiconductor wire partially surrounded by the gate stack structure, wherein the first semiconductor wire has a first surface and a second surface opposite to the first surface, and the gate stack structure is in direct contact with the first surface and without contacting the second surface;
a contact electrode in the first dielectric layer and electrically connected to the first semiconductor wire, wherein the contact electrode and the gate stack structure extend from the first semiconductor wire in opposite directions, and the contact electrode is in direct contact with the second surface;
a second semiconductor wire, wherein the gate stack structure further partially surrounds the second semiconductor wire, and wherein the gate stack structure is confined between the first semiconductor wire and the second semiconductor wire; and
a third semiconductor wire, wherein the contact electrode is connected to the first semiconductor wire and the third semiconductor wire and confined between the first semiconductor wire and the third semiconductor wire.

2. The semiconductor device structure as claimed in claim 1, further comprising:
an adhesive layer adjoining the gate stack structure and the first semiconductor wire; and
a second dielectric layer extending from the adhesive layer along the contact electrode.

3. The semiconductor device structure as claimed in claim 2, wherein an interface between the gate stack structure and the adhesive layer is substantially coplanar with an interface between the first dielectric layer and the contact electrode.

4. The semiconductor device structure as claimed in claim 2, wherein the adhesive layer extends between the second dielectric layer and the contact electrode, and the adhesive layer further adjoins the contact electrode.

5. The semiconductor device structure as claimed in claim 1, wherein the contact electrode partially surrounds the first semiconductor wire.

6. The semiconductor device structure as claimed in claim 1, wherein the gate stack structure is substantially parallel to the contact electrode without overlapping the contact electrode.

7. A semiconductor device structure, comprising:
a first semiconductor wire;
a second semiconductor wire;
a gate stack structure in a first dielectric layer extending between the first semiconductor wire and the second semiconductor wire, wherein the first semiconductor wire and the second semiconductor wire are partially surrounded by the gate stack structure;
a first contact electrode in the first dielectric layer electrically connected to the first semiconductor wire;
a second contact electrode electrically connected to the second semiconductor wire, wherein the first contact electrode and the second contact electrode extend away from each other in opposite directions;
an adhesive layer adjoining the gate stack structure and the first semiconductor wire; and
a second dielectric layer extending from the adhesive layer along the first contact electrode, wherein an interface between the gate stack structure and the adhesive layer is substantially coplanar with an interface between the first dielectric layer and the first contact electrode.

8. The semiconductor device structure as claimed in claim 7, wherein the gate stack structure is staggered with respect to the first contact electrode and the second contact electrode.

9. The semiconductor device structure as claimed in claim 7, wherein a distance between the first contact electrode and the second contact electrode is greater than a distance between the first semiconductor wire and the second semiconductor wire.

10. The semiconductor device structure as claimed in claim 7, further comprising:
a third semiconductor wire;
a fourth semiconductor wire, wherein the third semiconductor wire is between the fourth semiconductor wire and the second semiconductor wire;
a second gate stack structure extending between the third semiconductor wire and the fourth semiconductor wire; and
a third contact electrode extending from the third semiconductor wire towards the second semiconductor wire, wherein a distance between the gate stack structure and the second gate stack structure is greater than a distance between second contact electrode and the third contact electrode.

11. The semiconductor device structure as claimed in claim 10, wherein the distance between the gate stack structure and the second gate stack structure is substantially equal to a distance between second semiconductor wire and the third semiconductor wire.

12. A semiconductor device structure, comprising:
a first semiconductor wire comprising a channel region and source/drain regions, wherein the first semiconductor wire has a first surface and a second surface opposite to the first surface;
a gate stack structure partially surrounding the channel region of the first semiconductor wire, wherein the gate stack structure extends from the first semiconductor wire in a first direction, and the gate stack structure is on the first surface;
contact electrodes connected to the source/drain regions of the first semiconductor wire, wherein the contact electrodes extend from the first semiconductor wire in a second direction that is opposite to the first direction;
a first dielectric layer between the contact electrodes, wherein the first dielectric layer extends away from the channel region of the first semiconductor wire in the second direction, and the first dielectric layer and the contact electrodes are on the second surface; and
a second dielectric layer surrounding the first semiconductor wire, the gate stack structure, the contact electrodes and the first dielectric layer, wherein the first dielectric layer and the second dielectric layer are separated by the contact electrodes.

13. The semiconductor device structure as claimed in claim 12, wherein the first dielectric layer and the second dielectric layer comprise different materials.

14. The semiconductor device structure as claimed in claim 12, further comprising an adhesive layer sandwiched between the channel region of the first semiconductor wire and the first dielectric layer.

15. The semiconductor device structure as claimed in claim 14, wherein the adhesive layer extends between the contact electrodes and the first dielectric layer.

16. The semiconductor device structure as claimed in claim 12, wherein the contact electrodes surround the source/drain regions of the first semiconductor wire, and wherein an overlapping area between the contact electrodes and the gate stack structure is less than an overlapping area between the contact electrodes and the first dielectric layer.

17. The semiconductor device structure as claimed in claim 12, wherein an overlapping area between the contact electrodes and the first dielectric layer is greater than an overlapping area between the gate stack structure and the first dielectric layer.

18. The semiconductor device structure as claimed in claim 12, further comprising a second semiconductor wire, wherein the gate stack structure further partially surrounds the second semiconductor wire, and wherein the gate stack structure is confined between the first semiconductor wire and the second semiconductor wire.

19. The semiconductor device structure as claimed in claim 12, further comprising a second semiconductor wire, wherein one of the contact electrodes is connected to the first semiconductor wire and the second semiconductor wire and confined between the first semiconductor wire and the second semiconductor wire.

20. The semiconductor device structure as claimed in claim 1, further comprising:

a second dielectric layer surrounding the first semiconductor wire, the gate stack structure, the contact electrode and the first dielectric layer, wherein the first dielectric layer and the second dielectric layer are separated by the contact electrode.

* * * * *